(12) United States Patent
Ku et al.

(10) Patent No.: US 11,153,990 B2
(45) Date of Patent: Oct. 19, 2021

(54) MOVABLE HEAT-TRANSFER SYSTEM

(71) Applicant: Intel Corporation, Santa Clara, CA (US)

(72) Inventors: Jeff Ku, Taipei (TW); Gavin Sung, Taichung (TW); Tim Liu, New Taipei (TW); Gerry Juan, Taipei (TW); Jason Y. Jiang, Taipei (TW)

(73) Assignee: Intel Corporation, Santa Clara, CA (US)

( * ) Notice: Subject to any disclaimer, the term of this patent is extended or adjusted under 35 U.S.C. 154(b) by 228 days.

(21) Appl. No.: 16/231,169

(22) Filed: Dec. 21, 2018

(65) Prior Publication Data

US 2019/0141854 A1    May 9, 2019

(51) Int. Cl.
| | |
|---|---|
| *H05K 7/20* | (2006.01) |
| *G06F 1/20* | (2006.01) |
| *G06F 1/08* | (2006.01) |
| *H05K 1/02* | (2006.01) |

(52) U.S. Cl.
CPC .......... *H05K 7/20336* (2013.01); *G06F 1/08* (2013.01); *G06F 1/203* (2013.01); *G06F 1/206* (2013.01); *H05K 1/0209* (2013.01); *H05K 7/20154* (2013.01); *H05K 7/20172* (2013.01); *H05K 7/20409* (2013.01); *F28F 2280/10* (2013.01); *G06F 2200/201* (2013.01)

(58) Field of Classification Search
CPC .... F28F 2280/10; F28F 2280/105; F28F 5/00; H05K 7/20172; H05K 7/20409; H05K 7/20154; H05K 7/2049; H05K 7/20336; H05K 1/0209; G06F 2200/201; G06F 1/206; G06F 1/203
See application file for complete search history.

(56) References Cited

U.S. PATENT DOCUMENTS

| | | | | |
|---|---|---|---|---|
| 5,946,187 A * | 8/1999 | Cipolla | .................... | G06F 1/203 16/371 |
| 6,075,696 A * | 6/2000 | Progl | ....................... | G06F 1/203 16/226 |
| 6,359,780 B1 * | 3/2002 | McMahan | ............... | G06F 1/203 165/104.33 |

(Continued)

FOREIGN PATENT DOCUMENTS

EP            0702287 A2 *   3/1996   .............  G06F 1/203

*Primary Examiner* — Tho V Duong
(74) *Attorney, Agent, or Firm* — Patent Capital Group

(57) ABSTRACT

In one aspect, an apparatus comprises a housing, a heat-generating component, a heat spreader, and a heat-transfer pipe. The housing forms a cavity in which the heat-generating component is located. The heat spreader is operable to distribute heat over a portion of the housing. The heat-transfer pipe is pivotally coupled to the heat-generating component and the heat spreader. The heat-transfer pipe operable to transfer heat from the heat-generating component to the heat spreader. The heat-transfer pipe and the heat spreader are movable between a first configuration and a second configuration. In the first configuration, a gap separates the heat spreader and the portion of the housing based on the heat-transfer pipe being at a first orientation. In the second configuration, the heat spreader closes the gap and is thermally coupled to the portion of the housing based on the heat-transfer pipe being at a second orientation.

18 Claims, 23 Drawing Sheets

(56) References Cited

U.S. PATENT DOCUMENTS

| | | | | |
|---|---|---|---|---|
| 6,377,452 B1* | 4/2002 | Sasaki | ............... | G06F 1/203 |
| | | | | 165/104.33 |
| 2004/0080908 A1* | 4/2004 | Wang | ............... | G06F 1/203 |
| | | | | 361/679.47 |
| 2007/0008702 A1* | 1/2007 | Chang | ............... | F28F 1/20 |
| | | | | 361/703 |
| 2015/0354901 A1* | 12/2015 | Moore | ............... | F28D 15/0275 |
| | | | | 165/104.21 |
| 2018/0267578 A1* | 9/2018 | Ho | ............... | G06F 1/1681 |

\* cited by examiner

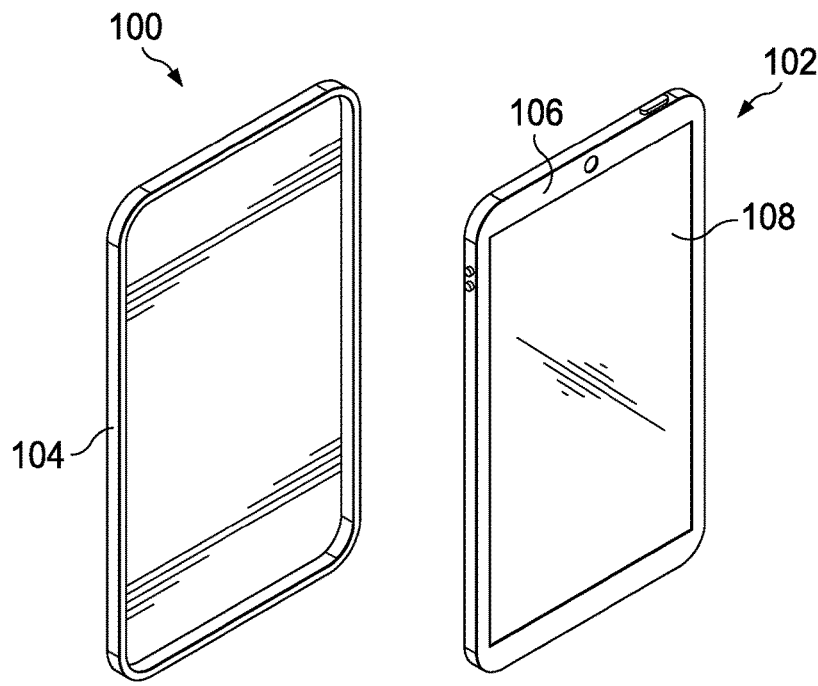
FIG. 1
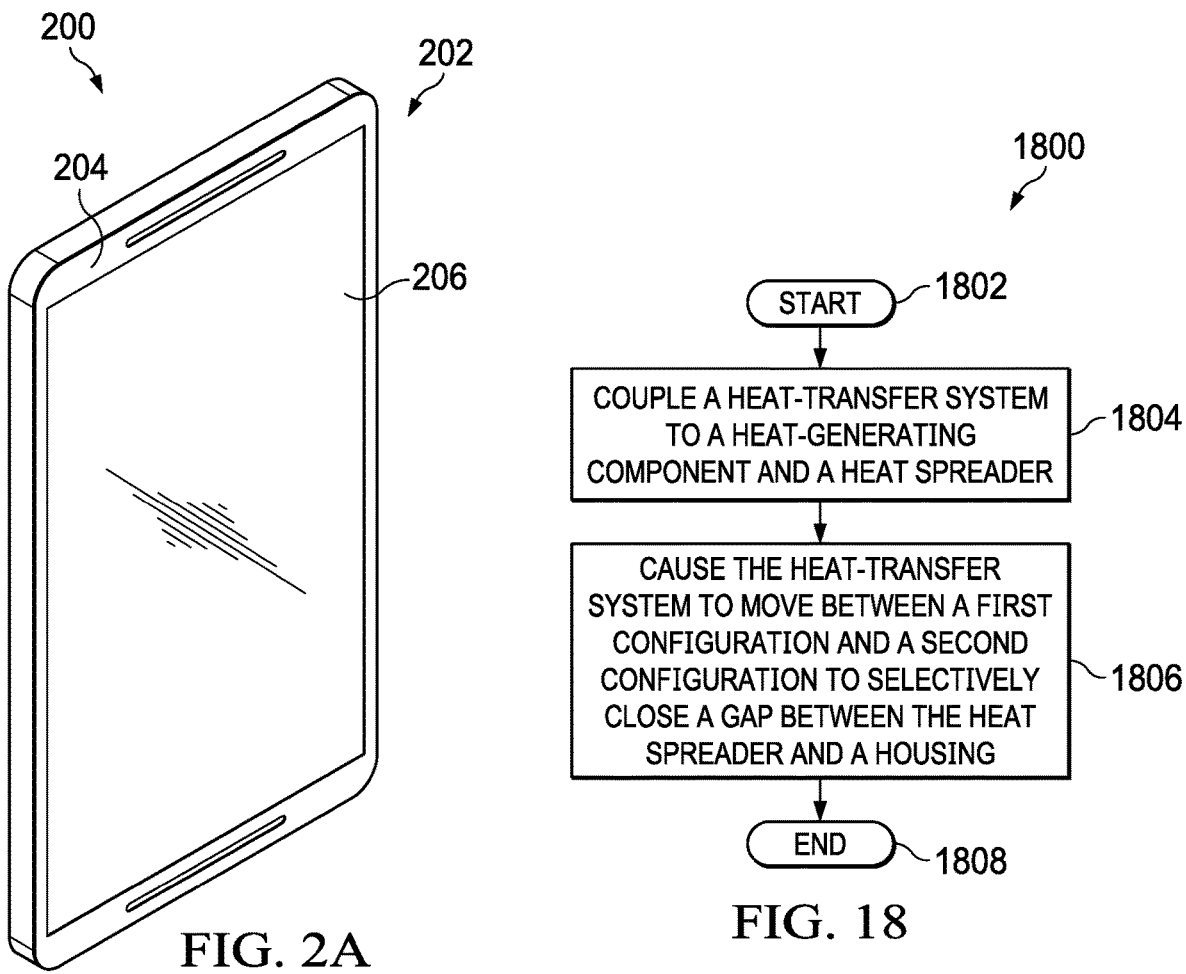
FIG. 2A
FIG. 18

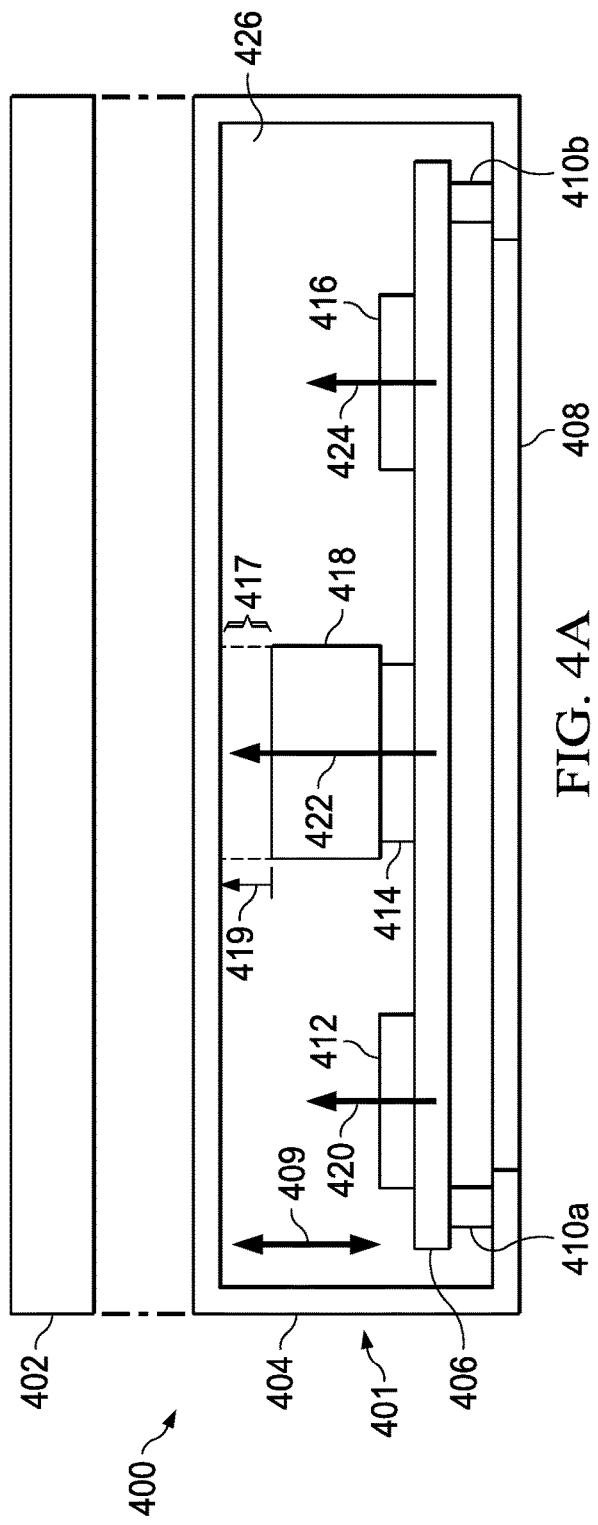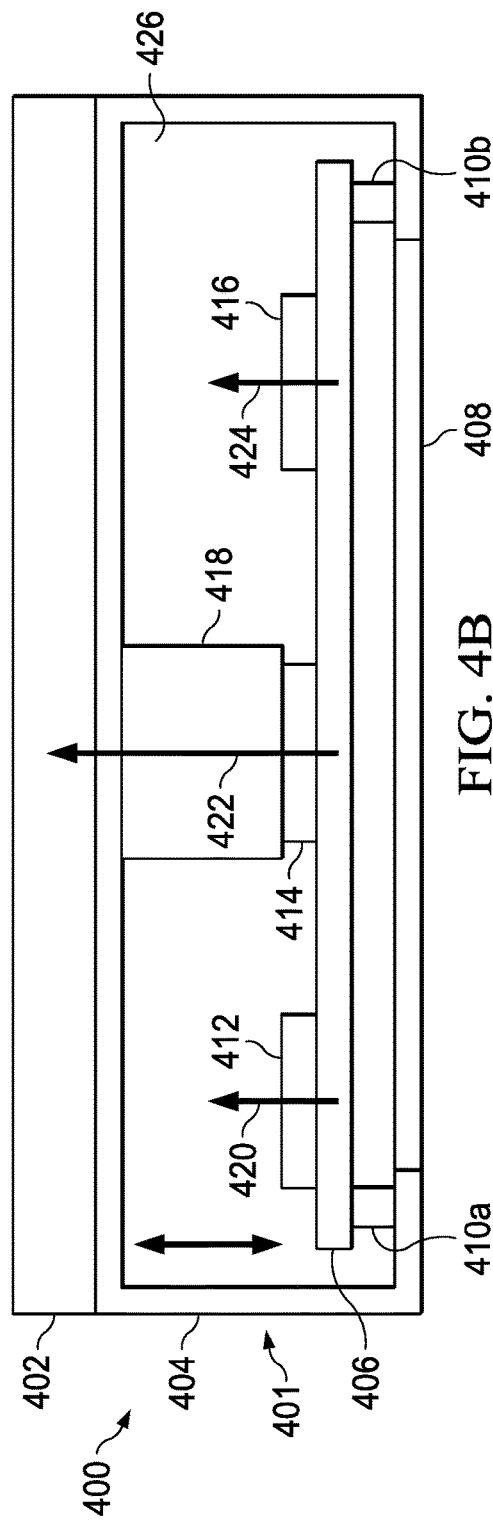

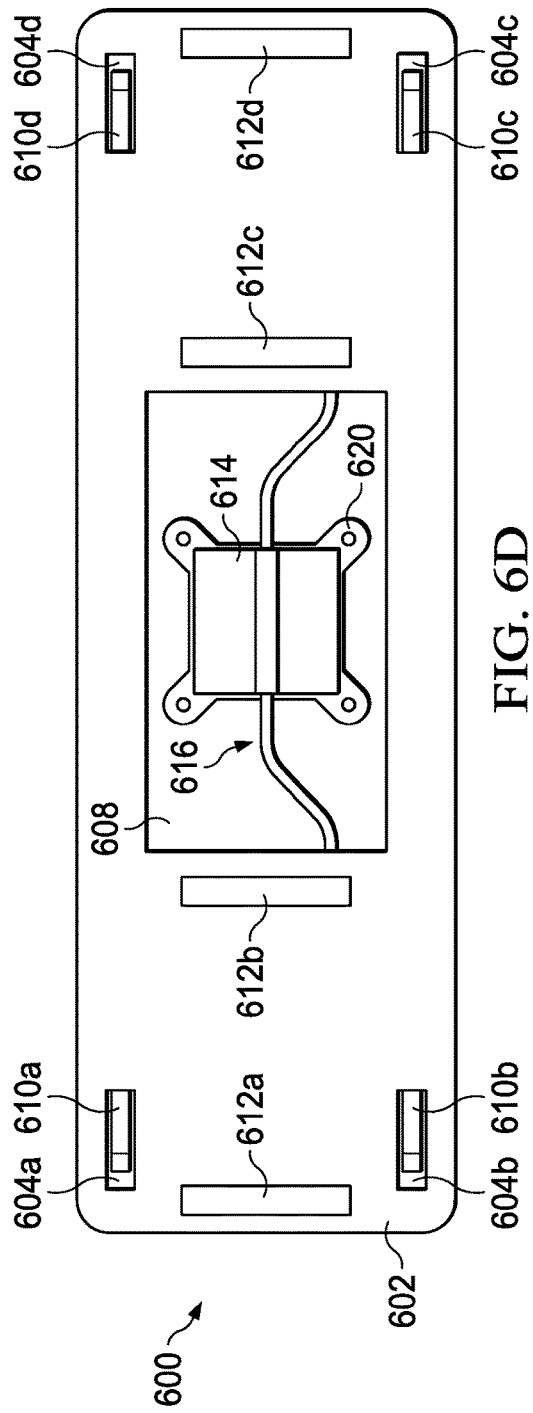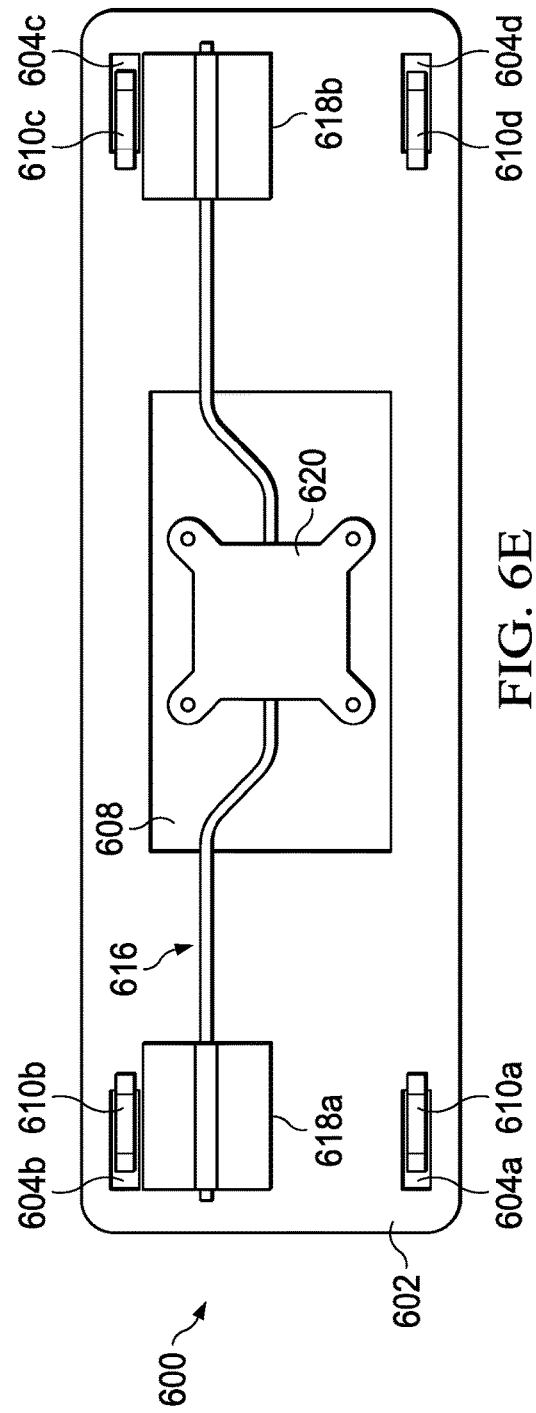

MOVABLE HEAT-TRANSFER SYSTEM

TECHNICAL FIELD

Embodiments described generally relate to the field of temperature control systems and more particularly to systems for dissipating heat using a movable heat-transfer device.

BACKGROUND

Many devices (e.g., electrical devices, mechanical devices, and/or electromechanical devices) generate heat during operation. Such devices can include, for example, tablet, a mobile phone, a computer, a set top box, an automobile, an aircraft, combinations thereof, and/or manufacturing equipment. In many cases, the generated heat must be dissipated to prevent the device (and/or the components therein) from overheating.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 1, 2A, 2B, 2C, 3A, and 3B illustrate various devices and attachable components, according to some embodiments of the present disclosure;

FIGS. 4A and 4B illustrate simplified cross-sections of a movable heat-transfer device cooling a device based on attachment of a component, according to some embodiments of the present disclosure;

FIGS. 6A, 6B, 6C, 6D, and 6E illustrate various views of a movable heat-transfer device, according to some embodiments of the present disclosure;

FIG. 18 illustrates a method, according to some embodiments of the present disclosure.

DESCRIPTION OF EMBODIMENTS

Figure 2B:
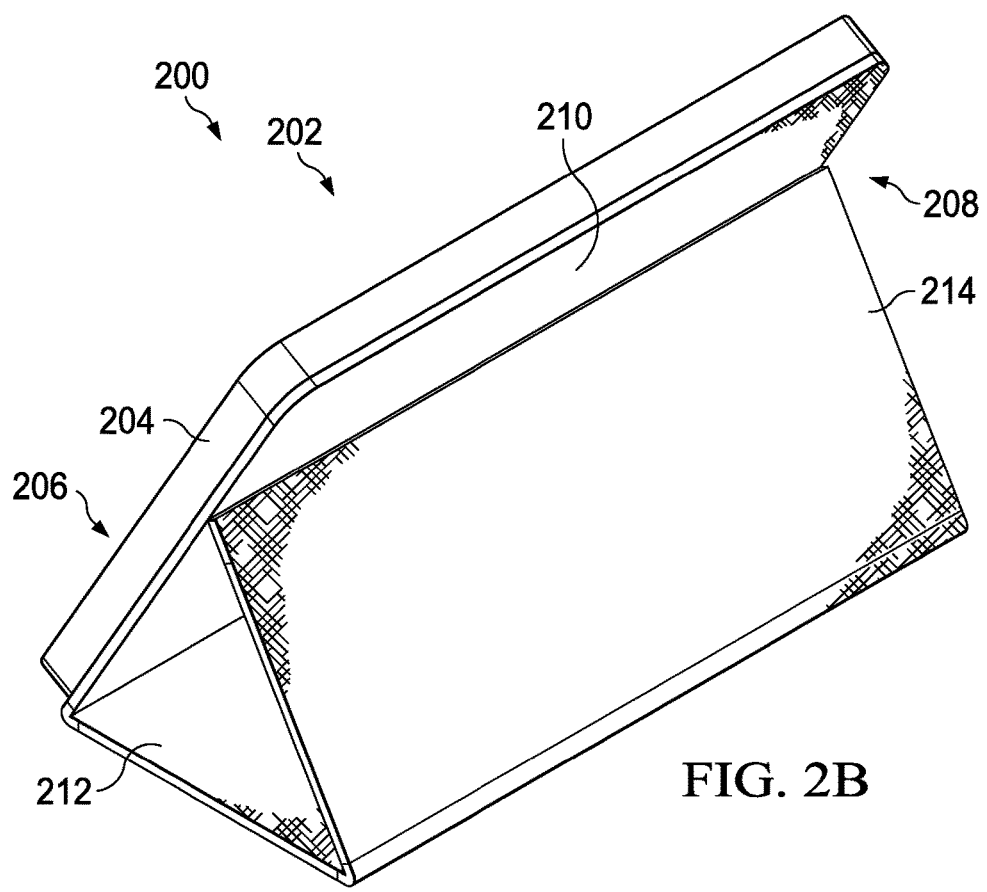

A device may include one or more heat-generating components. A heat-generating component generates heat during its operation. For example, a heat-generating component can comprise a processor, a power source (e.g., battery), a power converter, a sensor, mechanical component (e.g., a piston), a component operably coupled to circuit board, combinations thereof, and/or any other device or component (electrical and/or mechanical). One technical problem for such devices is that the generated heat must be dissipated to prevent the device (and/or the components therein) from reaching a limiting temperature such as a temperature at which the device and/or component stops functioning or its functioning is impaired (e.g., reduced efficiency). The devices generate more heat than they can dissipate and, therefore, can benefit from a cooling system. FIGS. 1, 2A, 2B, 2C, 3A, and 3B illustrate various devices and attachable components, according to some embodiments of the present disclosure; these Figures are described in further detail below.

Heat-transfer systems are used to cool such devices and/or components by transferring heat away from heat-generating components. Such heat-transfer systems dissipate the heat by, e.g., rejecting some of the heat to the ambient environment and converting some of the heat to other forms of energy (such as kinetic energy) along the way. A heat-transfer system has a thermal resistance that quantifies its ability to transfer heat (i.e., its resistance to heat flow). Thermal resistance is measured, e.g., in degrees (e.g., Celsius (C) or Kelvin (K)) per watt (e.g., ° C./W or K/W). The thermal resistance relates the power (watts) input to the heat-transfer system to a difference in temperature (measured in ° C. or ° K) that results from the heat resistance of the heat-transfer system. The difference in temperature is measured between a heat source location and a heat rejection location. For each of a range of power inputs, the heat-transfer system produces a temperature difference value. For heat-transfer systems using solid conductors (e.g., aluminum, graphite, and the like), the thermal resistance is substantially linear as the power increases (e.g., a plot of the thermal resistance over a range of values has a linear slope).

FIG. 1 illustrates a system 100, which includes a device 102 and a cover 104. In this example, the device 102 is a mobile phone. The device 102 includes a housing 106 and a screen 108. The screen 108 may be a touchscreen, which is operable to receive input based on touches on the screen 108 and to generate output such as graphics on the screen 108. The housing 106 forms a cavity (not visible), which contains several heat-generating components. The cover 104 is attachable to the housing 106. In some examples, the cover 104 is a protective cover configured, e.g., to protect the device 102 from physical damage.

Figure 2C:
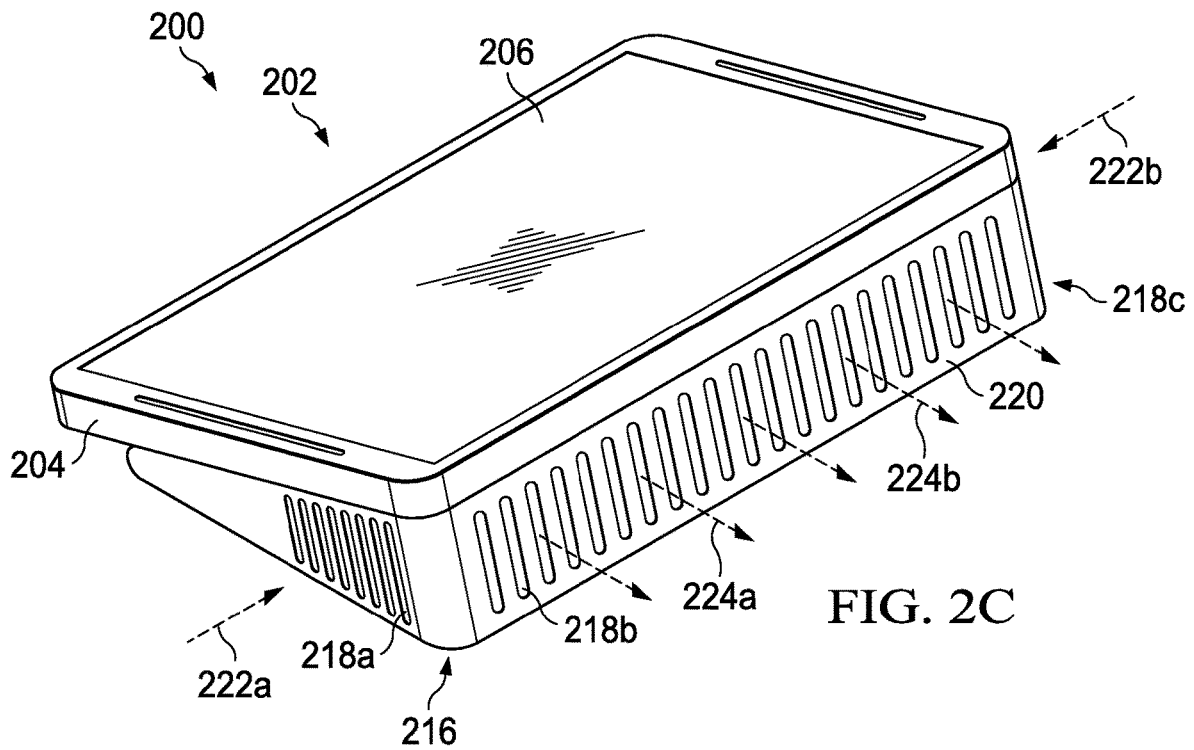

FIG. 2A illustrates a system 200, which includes a device 202. The device 202 may be a tablet or any other device. The device 202 includes a housing 204 and a screen 206. The screen 206 may be a touchscreen. The housing 204 forms a cavity (not visible), which contains several heat-generating components. FIGS. 2B and 2C illustrate various components that can be coupled to the device 202.

FIG. 2B illustrates the system 200, including the device 202 and a stand cover 208. The stand cover 208 is attachable to the housing 204. In some examples, the stand cover 208 is to support the device 202, e.g., to free a user's hands while using the device 202 and/or viewing the screen 206 of the device 202. The stand cover 208 includes panels 210, 212, and 214. The panels 210, 212, and 214 are coupled to one another. The panels 210, 212, and 214 are rotatable to various configurations that enable the stand cover 208 to support the device 202, e.g., as illustrated in the FIG. 2B.

FIG. 2C illustrates the system 200, including the device 202 and a fan dock 216. The fan dock 216 is attachable to the housing 204. In some examples, the fan dock 216 is to support the device 202 while simultaneously cooling the device 202 by passing a cooling layer of air near the device. Walls of the fan dock 216 include vents 218a, 218b, and 218c. The fan dock 216 includes a fan system (not shown) enclosed within the walls. The fan system draws air in through and expels air out of the vents 218a, 218b, and 218c. For example, the fan system may draw in cool air 222a and 222b through the vents 218a and 218c, respectively. The cool air 222a and 222b absorbs heat from the device 202 as it passes through the fan dock 216. The fan system expels hot air 224a and 224b through the vent 218b to cool the device 202.

Figure 3A:
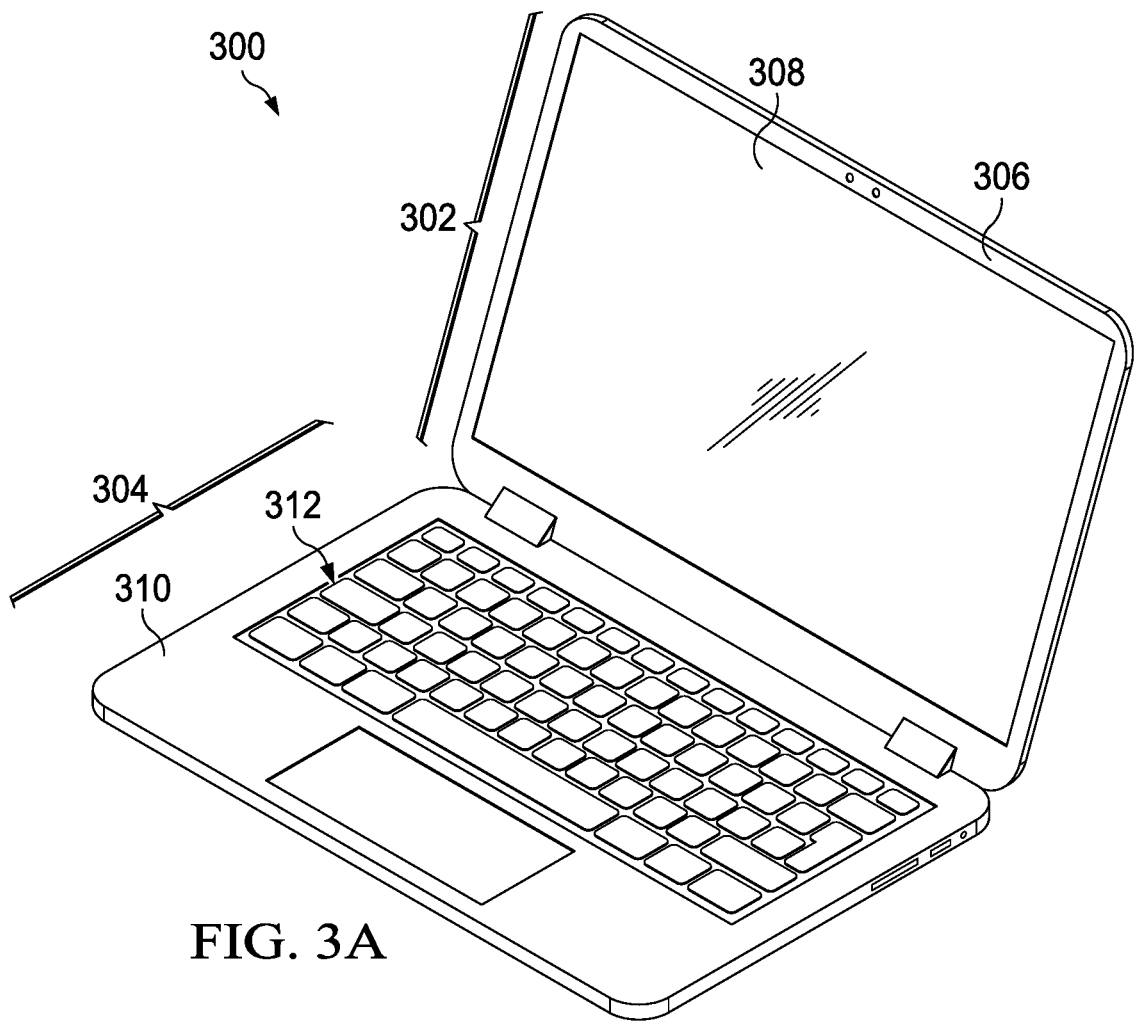
Figure 3B:
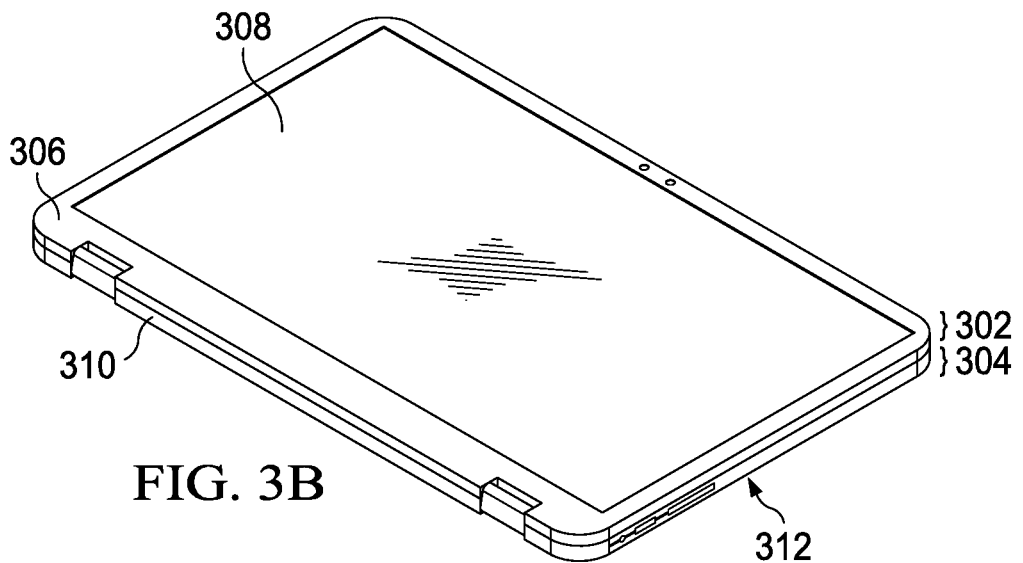

FIG. 3A illustrates a device 300, which includes a screen portion 302 and a keyboard portion 304, which are attached to one another. The device 300 may be a personal, mobile computer such as a laptop computer, or any other device. The screen portion 302 includes a housing 306 and a screen 308. The screen 308 may be a touchscreen. The housing 306 forms a cavity (not visible), which contains several heat-generating components. The keyboard portion 304 includes a housing 310 and a keyboard 312. The housing 310 forms a cavity (not visible), which contains several heat-generating components. The keyboard 312 includes a plurality of keys, each of which is operable to receive input based on key presses. The screen portion 302 and the keyboard portion 304 are rotatable relative to one another. For example, FIG. 3A illustrates the screen portion 302 and the keyboard portion 304 at approximately a right angle with respect to one another. This position enables use of both the keyboard 312 and the screen 308 while a back of the keyboard portion 304 (e.g., a side of the housing 310 opposite the keyboard 312) is supported on a surface. The screen portion 302 and the keyboard portion 304 can be folded in either direction to close or further open the device 300. FIG. 3B illustrates the screen portion 302 and the keyboard portion 304 approximately parallel to one another. This position enables use of the screen 308 while a front of the keyboard portion 304 (e.g., a same side of the housing 310 on which the keyboard 312 is located) is supported on a surface. Either of the screen portion 302 and the keyboard portion 304 can be rotated approximately 360 degrees relative to the position shown in FIG. 3B to close the device 300.

A challenge associated with devices such as devices 102, 202, and 300 is that heat-generating components onboard such a device can cause the device to get hot. For example, a heat-generating component may have a normal operating temperature range of about 45-100° C. and a maximum safe operating temperature of about 200° C. Some heat-generating components are encapsulated in a sealed housing. The heat-generating components are cooled via conduction through the housing. Some devices including an air gap between the heat-generating components and the housing to help isolate the heat, generated by the heat-generating components, from housing. The air gap helps to spread the heat across a larger area of the housing, e.g., relative to the area of the heat generating component. The air gap can help to maintain a safe surface temperature of the device even while the heat-generating components are operating well above the safe surface temperature. As the size of the gap increases, so too does the thermal resistance of the gap. This increased thermal resistance can lead to an increased operating temperature of a heat-generating component, which can inhibit its ability to properly function, reduce an operational lifespan of the heat-generating component, reduce operational efficiency, cause a failure, and/or overheat nearby components. The increased operating temperature makes it challenging to keep the heat-generating component cool and below its maximum safe operating temperature.

In some cases, a housing of the device is made from a thermally conductive material, which is capable of transferring heat from a heat-generating component. Although the housing is capable of conducting the heat, directly attaching a heat-generating component the housing to do so could cause an exterior of the housing to reach a temperature that is uncomfortable and/or unsafe for a user of the device. For example, the user may experience temperatures that feel too hot or may even cause burns to a user. Thus, a technical challenge associated with such devices is balancing the countervailing demands of cooling the heat-generating components and maintaining safe and/or comfortable surface temperatures for users. A potential solution is to actively pump a liquid through the device to cool the heat-generating component. Such active cooling can be financially costly, resource intensive, and may, e.g., require constant power to maintain cooling. Another potential solution is to slow down an operating speed of a heat-generating component. For example, a chip may operate at a certain clock rate, measured in Hertz. However, if the chip gets too hot, such as within a certain threshold of its maximum safe operating temperature, the clock rate may be intentionally slowed down in an attempt to reduce the amount of heat generated by the chip and, thereby, reduce its temperature. This slowing of the clock rate has the effect of slowing the performance of the chip and reduces the number of operations that the chip can perform per unit time. There is a need for a heat-transfer system that can transfer heat to a housing of a device to cool heat-generating components therein while simultaneously maintaining safe and/or comfortable device surface temperatures for users of a device and without compromising performance of the heat-generating components.

A solution to the above identified challenges (and others) presented herein includes a heat-transfer device comprising a heat spreader and a heat-transfer mechanism. The heat spreader can distribute heat over a portion of a housing. The heat-transfer mechanism is movably coupled to a heat-generating component and the heat spreader. The heat-transfer mechanism transfers heat between the heat-generating component and the heat spreader. Advantageously, the heat-transfer mechanism and the heat spreader are movable between a first configuration and a second configuration, which help balance the countervailing demands of cooling the heat-generating component and maintaining safe surface temperature of the housing. In the first configuration, a gap separates the heat spreader and the portion of the housing based on the heat-transfer mechanism being at a first orientation. The gap can help maintain a safe surface temperature of the housing, e.g., by spreading heat generated by the heat-generating component across the housing. In the second configuration, the heat spreader closes the gap and is thermally coupled to the portion of the housing based on the heat-transfer mechanism being at a second orientation. In some examples, thermally coupling the heat spreader and the portion of the housing enables transmission of heat to the housing when the housing is unlikely to affect a user, e.g., when another component is attached to the housing. In addition, some heat-generating components, such as chipsets and processors, may operate at an increased clock rate due to the additional heat transfer capacity provided by operation of the heat-transfer devices of the present disclosure. In some examples, the heat-transfer device does not require a power supply to power its operation. This enables the heat-transfer device to operate in low power devices, such as those using, e.g., 5 W of power or less and prevents the heat-transfer device from competing with other components for power.

FIGS. 4A and 4B illustrate simplified cross-sections of a system 400 including a movable heat-transfer device cooling a device 401 based on attachment of a component 402, according to some embodiments of the present disclosure. In some examples, the device 401 is representative of any one or more of the devices 102, 202, and 300 of FIGS. 1, 2A, 2B, 2C, 3A, and 3B. In such examples, the component 402 may be representative of the cover 104, the stand cover 208, the fan dock 216, the housings 310 or 306, or any other component that may be attached to, coupled to, or selectively in contact with the device.

The system 400 of FIGS. 4A and 4B includes the device 401 and the component 402. The component 402 may be coupled in or attached to the device 401. The device 401 includes a housing 404, an input/output (I/O) component 408, a circuit board 406, heat-generating components 412, 414, and 416, and a heat-transfer device 418. The housing 404 and the I/O component 408 are attached to one another. The housing 404 forms a cavity 426, in which the circuit board 406, the heat-generating components 412, 414, and 416, and the heat-transfer device 418 are located. The housing 404 may be made of a rigid material. In some examples, the housing comprises a metallic material (e.g., aluminum, alloy, steel such as stainless steel, or any other metal), a non-metallic material, a plastic material, or any other material. The circuit board 406 is supported on pedestals 410a and 410b coupled to the housing 404. The I/O component 408 may include a screen, a keyboard, or other I/O device. Each of the heat-generating components 412, 414, and 416 may include a processor, a memory element, a power source, a power converter, a sensor, an integrated circuit, combinations thereof, or any other component. The heat-transfer device 418 is operable to transfer heat between the heat-generating component 414 and the housing 404.

Some of the heat-generating components 412, 414, and 416 are separated from the housing 404 by a gap. A size of the gap is measured in a linear distance between an inner surface of the housing 404 and a top of the corresponding heat-generating component. A gap 409 separates the heat-generating components 412 and 416 from the housing 404. The gap 409 is a break in paths of thermal conductivity 420 and 424 between the heat-generating components 412 and 416, respectively, and the housing 404. The heat-transfer device 418 is thermally coupled to the heat-generating component 414. The heat-transfer device 418 is movable between a first configuration, illustrated in FIG. 4A, and a second configuration, illustrated in FIG. 4B. In the first configuration, the device 401 and the component 402 are decoupled from one another. In the second configuration, the device 401 and the component 402 are coupled to one another.

The heat-transfer device 418 moves between the first configuration and the second configuration based on proximity between the device 401 and the component 402. In the first configuration, as illustrated in FIG. 4A, a gap 417 separates the heat-transfer device 418 and the housing 404 based on the component 402 and the device 401 being decoupled from one another. The gap 417 is a break in a path of thermal conductivity 422 between the heat-generating component 414 and the housing 404. When transitioning from the first configuration to the second configuration, the heat-transfer device 418 moves by a distance 419 to close the gap 417 as illustrated by the dashed lines in FIG. 4A. In the second configuration, as illustrated in FIG. 4B, the heat-transfer device 418 closes the gap and is thermally coupled to the housing 404 based on the based on the component 402 and the device 401 being coupled to one another. This connects the path of thermal conductivity 422 between the heat-generating component 414 and the housing 404, which enables heat transfer from the heat-generating component 414 to the component 402 via the housing 404. In some examples, the heat-transfer device 418 includes a rotatable and/or extendable heat pipe mechanism which is triggered to rotate and/or extend based on the component 402 and the device 401 being coupled to one another.

The component 402 provides a layer of protection between a user and heat generated within the device 401 and also provides a pathway for heat dissipation, such as through a conductive layer of the component 402. The component 402 serving as the layer of protection can include the component 402 preventing heat from the housing 404 from directly contacting the user. Traditional heat-transfer systems lack the ability to take advantage of this capability of the component 402, when available, at least because they are not movable based on the proximity of the component 402. Advantageously, the heat-transfer device 418 takes advantage of this capability of the component 402 by moving to the second configuration based on the component 402 and the device 401 being coupled to one another. In addition, the heat-transfer device 418 moves back to the first configuration based on the component 402 and the device 401 being decoupled from one another to prevent overheating the housing 404 when the component 402 is unavailable for heat-transfer an as a layer of protection.

Figure 5:
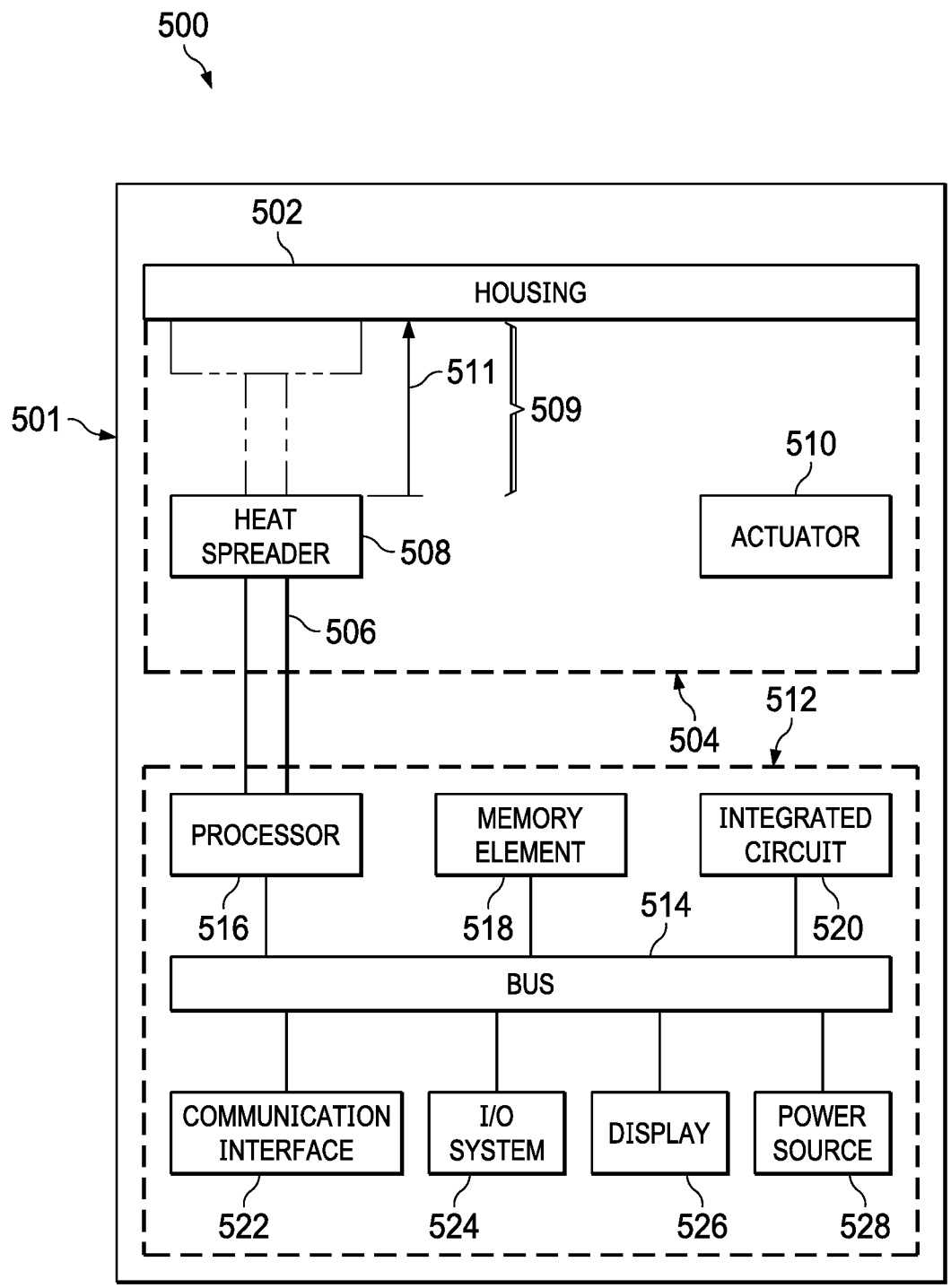
FIG. 5 is a simplified component diagram of a computing device comprising heat-generating components and a movable heat-transfer device, according to some embodiments of the present disclosure.

FIG. 5 is a simplified component diagram of system 500 including a computing device 501, according to some embodiments of the present disclosure. The computing device 501 is an example of any one or more of the devices 102, 202, and 300 of FIGS. 1, 2A, 2B, 2C, 3A, and 3B. The computing device 501 includes a housing 502, a heat-transfer system 504, and a computing system 512. The heat-transfer system 504 includes a heat spreader 508, a heat-transfer pipe 506, and an actuator 510. The computing system 512 includes a processor 516 for processing data, a memory element 518 for storing data, an integrated circuit (IC) 520 for processing data, a communication interface 522 for transmitting and receiving data over a network, an I/O system 524 for receiving input and/or generating output, display 526 for rendering graphics, a power source 528 for providing power to the computing system 512, and a bus 514 to facilitate communications between the other components. Each of these components may generate heat during operation. The computing system 512 may comprise a circuit board such as a printed circuit board (PCB) to which each of the components is coupled. In further examples, one or more of the components comprises a die, which is coupled to the circuit board with a solder.

The processor 516 may be a microprocessor, controller, or any other suitable computing device, resource, or combination of hardware, stored software and/or encoded logic operable to process data.

The memory element 518 may comprise any form of volatile or non-volatile memory including, without limitation, magnetic media (e.g., one or more tape drives), optical media, random access memory (RAM), read-only memory (ROM), flash memory, removable media, an erasable programmable read only memory (EPROM), an electrically erasable programmable ROM (EEPROM)), or any other suitable memory component or components.

The IC 520 may be a field programmable gate array (FPGA), an application-specific integrated circuit (ASIC) or any other type of integrated circuit. In some embodiments, the IC 520 includes a die. The IC 520 may include a ball grid array (BGA) providing an electrical interface to a circuit board. The die can be coupled to the circuit board with solder.

Operations outlined herein may be implemented using logic, which can include fixed logic, hardware logic, programmable logic, digital logic, etc. For example, in some embodiments, logic may be encoded in one or more tangible media, which may be inclusive of non-transitory tangible media and/or non-transitory computer readable storage media (e.g., embedded logic provided in an ASIC, embedded logic provided in an FPGA, logic provided digital signal processing instructions, in software [potentially inclusive of object code and source code] to be executed by a processor, or other similar machine, etc.).

The heat-transfer system 504 dissipates the heat generated by the heat-generating components in the computing system 512 by selectively transferring such heat to a portion of the housing 502. The heat spreader 508 is operable to transfer heat to the portion of the housing 502. The heat-transfer pipe 506 is moveably coupled to the processor 516 and the heat spreader 508. The heat-transfer pipe 506 is operable to transfer heat from the processor 516 to the heat spreader 508. The heat-transfer pipe 506 and the heat spreader 508 are movable between a first configuration and a second configuration. In the first configuration, a gap 509 separates the heat spreader 508 and the portion of the housing 502 based on the heat-transfer pipe 506 being at a first position. The gap 509 is a break in a path of thermal conductivity between the processor 516 and the housing 502. When transitioning from the first configuration to the second configuration, the heat spreader 508 and the heat-transfer pipe 506 move by a distance 511 to close the gap 509 as illustrated by dashed lines in FIG. 5. In the second configuration, the heat spreader 508 closes the gap 509 and is thermally coupled to the housing 502 based on the heat-transfer pipe 506 being at a second position. The actuator 510 is operable to move the heat-transfer pipe 506 and the heat spreader 508 between the first configuration and the second configuration. The actuator may include a passive actuator or an active actuator. A passive actuator requires little or no power for its operation. As an illustrative, non-limiting example, such a passive actuator may include a spring and a magnet generating opposing forces to move the heat transfer system between the first configuration and the second configuration. An active actuator may require power for its operation.

For clarity, FIG. 5 depicts a specific number of heat-transfer devices, heat generating components, heat spreaders, heat-transfer pipes, and actuators. However, any number of heat-transfer devices, heat generating components, heat spreaders, heat-transfer pipes, and actuators may be implemented in a system according to one or more embodiments of the present specification. As an example, a single heat-transfer device may be simultaneously coupled to (and dissipate heat from) more than one of the heat-generating components. As another example, multiple heat-transfer devices may be simultaneously coupled to (and dissipate heat from) a single heat-generating component. In addition, the FIG. 5 depicts the heat-transfer system 504 coupled to a specific heat generating component, i.e. the processor 516. However, the heat-transfer system 504 may be coupled to different and/or other heat-generating components in the computing system 512.

Figure 6A:
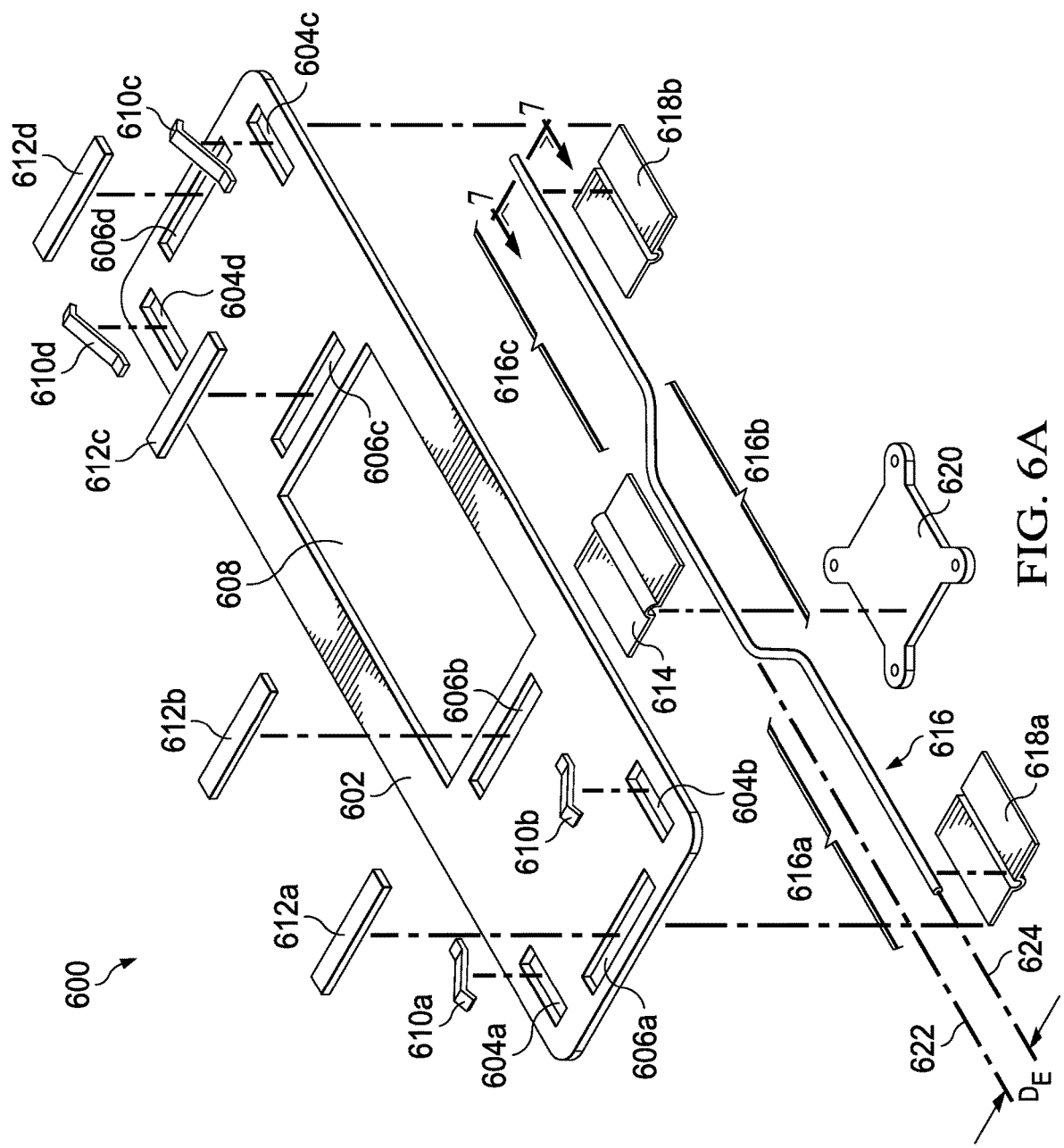
Figure 6B:
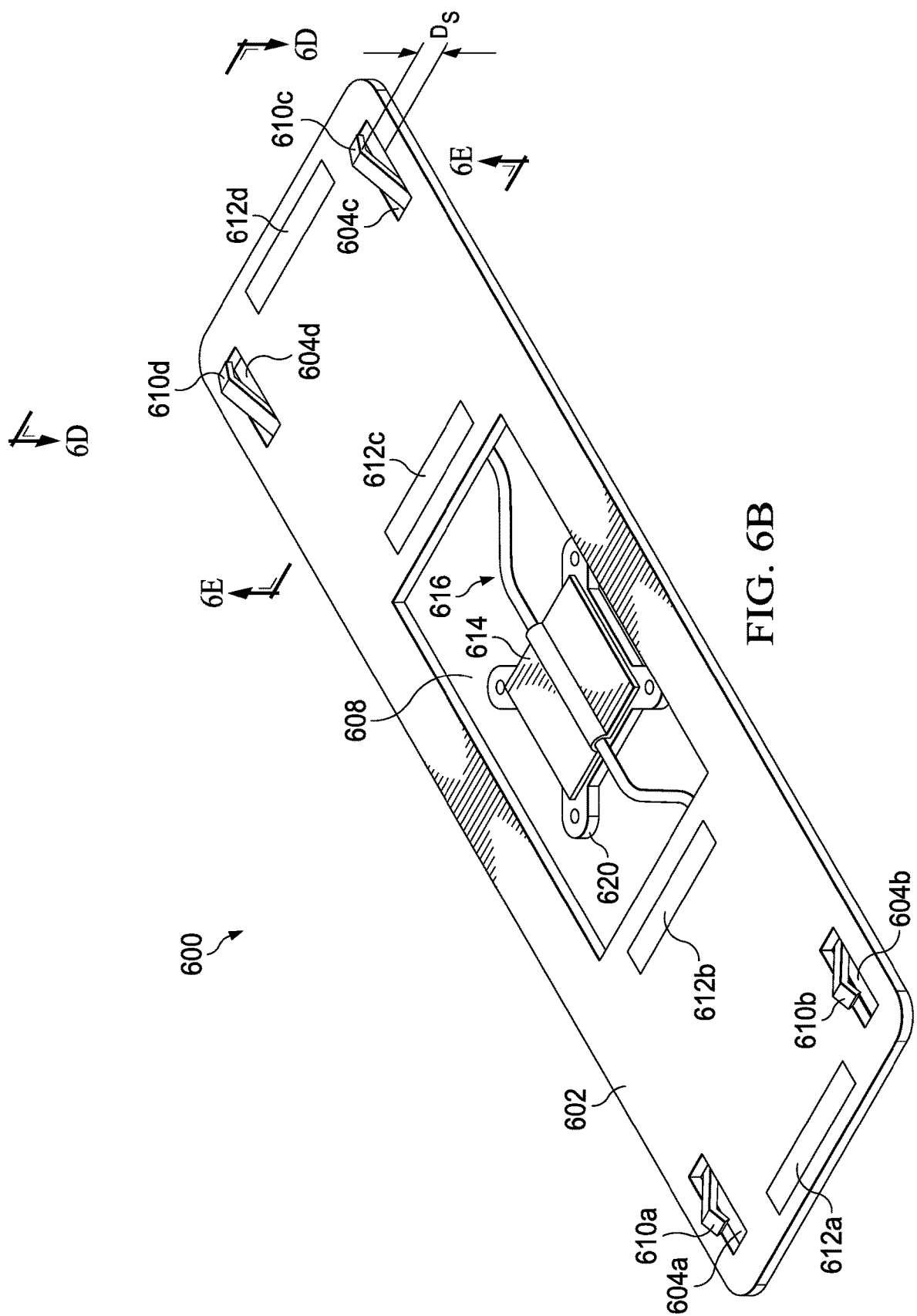
Figure 6C:
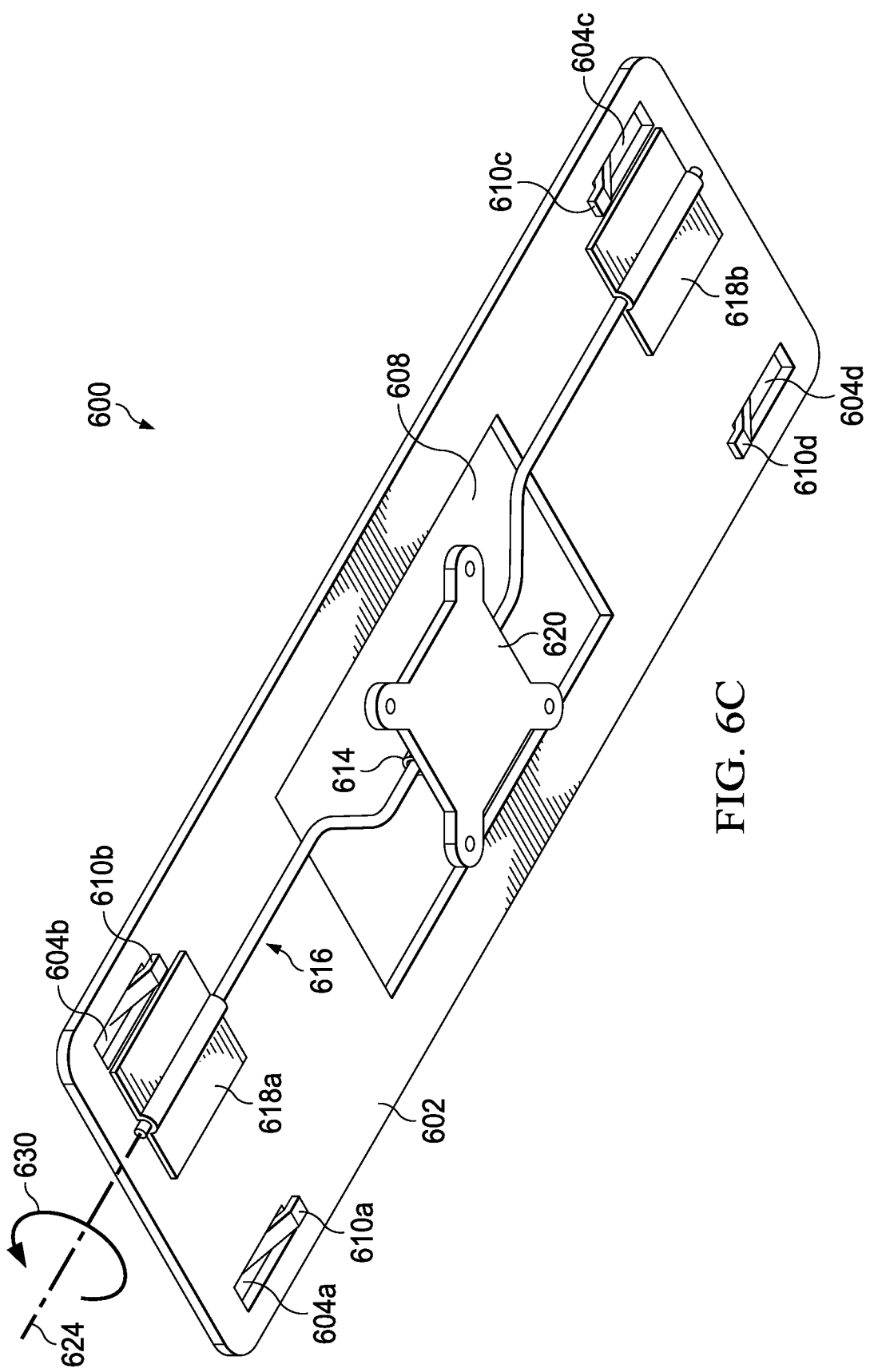

FIGS. 6A, 6B, 6C, 6D, and 6E illustrate various views of a heat-transfer device 600, according to some embodiments of the present disclosure. FIG. 6A illustrates an exploded view of the heat-transfer device 600. FIG. 6B illustrates an isometric view from above the heat-transfer device 600 when assembled. FIG. 6C illustrates an isometric view from below the heat-transfer device 600, when assembled. FIG. 6D illustrates a plan view from above the heat-transfer device 600, as generally indicated by the arrows labeled "6D" in the FIG. 6B. FIG. 6E illustrates a plan view from below the heat-transfer device 600, as generally indicated by the arrows labeled "6E" in the FIG. 6B.

The heat-transfer device 600 includes a heat spreader 602, magnets 612a, 612b, 612c, and 612d, springs 610a, 610b, 610c, and 610d, a heat-transfer pipe 616, brackets 618a, 618b, and 614, and a plate 620. The heat-transfer pipe 616 is rotatable to facilitate movement of other components of the heat-transfer device 600. The magnets 612a, 612b, 612c, and 612d are collectively referred to herein as the magnets 612. Each of the springs 610a, 610b, 610c, and 610d is a compression spring and comprises a plate made from a rigid material such as metal. Metal springs can help to provide electrical grounding from a circuit board to a housing of the device. The springs 610a, 610b, 610c, and 610d, are collectively referred to herein as the springs 610. The heat spreader 602 is operable to transfer heat to a portion of the housing of the device. The heat spreader 602 includes openings 604a, 604b, 604c, 604d, and 608, and recessions 606a, 606b, 606c, and 606d. The springs 610a, 610b, 610c, and 610d are attached to the heat spreader 602 and extend through the openings 604a, 604b, 604c, and 604d, respectively. When uncompressed, each of the springs 610 extends beyond the heat spreader 602 by a distance $D_S$, as illustrated in FIG. 6B. Advantageously, the springs 610 can flatten when compressed, which enables them to easily nest within the openings 604a, 604b, 604c, and 604d. The magnets 612 are attached to the heat spreader 602 in the recessions 606a, 606b, 606c, and 606d, respectively. The magnets 612 are to attract corresponding magnets on a component, such as the component 800 described below, and can facilitate movement of heat spreader 602 and rotation of the heat-transfer pipe 616. The springs 610 are to force the heat spreader 602 away from a housing and into a position that creates a gap between the heat spreader 602 and a housing. Because the springs 610 are compression springs, they generate a reactive force based on being compressed, e.g., to a length shorter than the distance $D_S$. The springs 610 and magnets 612 can generate opposing forces to move the heat-transfer device 600 between a first configuration and a second configuration. The brackets 618a, 618b, and 614 and the plate 620 are to attach the heat spreader 602, the heat-transfer pipe 616, and the heat generating component to one another. The heat-transfer pipe 616 is able to rotate within the brackets 618a, 618b, and 614. In some examples, a thermal interface material (TIM) is applied to the heat-transfer pipe 616. The TIM may include a gel that can thermally couple the heat-transfer pipe 616 and the brackets 618a, 618b, and 614 and can lubricate rotation of the heat-transfer pipe 616 within the brackets 618a, 618b, and 614.

Figure 7:
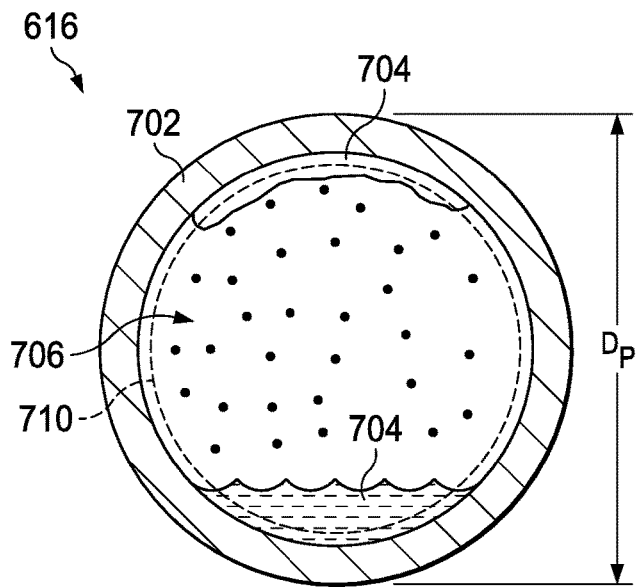
FIG. 7 is a simplified cross-section of a heat-transfer pipe, according to some embodiments of the present disclosure.

The heat-transfer pipe 616 is operable to transfer heat from a heat-generating component (not shown) to the heat spreader 602. Advantageously, the heat-transfer pipe 616 is rotatable between at least a first position and a second position as will be discussed further below. The heat-transfer pipe 616 includes several bends, which form continuous, noncollinear portions of the heat-transfer pipe 616. As illustrated in FIG. 6A, the heat-transfer pipe 616 includes pipe portions 616a, 616b, and 616c. The pipe portions 616a, 616b, and 616c are continuous with one another. An axis 624 is collinear with a centerline of the pipe portions 616a and 616c. An axis 622 is collinear with a centerline of the pipe portion 616b. The axis 622 and the axis 624 are offset from one another by a distance $D_E$. In some examples, the distance $D_E$ is greater than or equal to a size of a gap that is to be closed between the heat spreader 602 and a housing (see, e.g., a gap of distance $D_1$ in FIG. 10A, below). In some cases, the distance $D_E$ is about 0.5 mm, about 1 mm, or about 2 mm. The brackets 618a and 618b attach the pipe portions 616a and 616c, respectively, to the heat spreader 602. In some examples, an attachment mechanism couples the brackets 618a and 618b to the heat spreader 602. An attachment mechanism may include an adhesive, a mechanical fastener, combinations thereof, and/or any fastener. Exemplary adhesives include glue, resin, epoxy, or any other composition to bind two or more components. The bracket 614 and the plate 620 are attached to one another to hold the pipe portion 616b. The TIM (e.g., gel) may surround the pipe portion 616b such that the TIM lies between the pipe portion 616b and the plate and between the pipe portion 616b and the bracket 614. The plate 620 is to be coupled to the heat-generating component and/or a circuit board to which the heat-generating component is attached. In some examples, an attachment mechanism couples the bracket 614 and the plate 620 to one another, to the heat-generating component, and/or the circuit board to which the heat-generating component is attached. The heat-transfer pipe 616 is closed. A fluid within the heat-transfer pipe 616 is configured to circulate in a closed loop within an internal cavity of the heat-transfer pipe 616 to transfer heat between the heat-generating component and the heat spreader 602. FIG. 7, below, is an example cross section of the heat-transfer pipe 616.

The heat spreader 602 is a "two-dimensional" heat-transfer system that spreads heat over a larger area than the area of the heat-generating component. The heat spreader 602 receives heat from an area of the top surface of the heat-generating component and transfers the heat through the heat spreader 602 to an area of the housing with which the heat spreader 602 is in contact. The surface area of the heat spreader 602 is larger than the surface area of the heat generating component. Thus, in operation, the heat spreader 602 increases the surface area over which heat (generated by the heat-generating component) is dissipated. In addition, the heat from the heat-generating component is also converted to other forms of energy by the heat spreader 602. In some examples, the heat spreader 602 is a plate of thermally conductive material such as a metallic material (e.g., aluminum, copper, a metal alloy, steel such as stainless steel, combinations thereof, or any other metallic material) or any other thermally conductive material.

FIG. 7 is a cross-section of the heat-transfer pipe 616 of FIGS. 6A, 6B, 6C, 6D, and 6E, as generally indicated by the arrows labeled "7" in the FIG. 6A. The heat-transfer pipe 616 includes a tubular wall 702, a wick 710, and a fluid, i.e., a liquid 704, and a vapor 706. The heat-transfer pipe 616 has an outer diameter $D_P$, which is measured between opposing outer surfaces of the tubular wall 702. The liquid 704 is a liquid state of the fluid and the vapor 706 is a gaseous state of the fluid. The fluid is used to absorb and transfer heat through the heat-transfer pipe 616. The fluid may include water, coolant, a combination thereof, or any other fluid. The heat-transfer pipe 616 dissipates heat (e.g., provides cooling) based on the fluid changing phase. For example, as the liquid 704 absorbs heat it changes phase from a liquid state to a gaseous state. The vapor 706 is the gaseous state of the liquid 704. In some embodiments, about 10% of a total volume of the heat-transfer pipe 616 filled the liquid 704 and the remaining 90% filled with vapor. The percent filled with liquid versus vapor can vary between devices and also vary with temperature.

The wick 710 transports the liquid 704 to a location in the heat-transfer pipe 616 (e.g., a hot spot) where the liquid 704 absorbs heat from the heat-generating component and, thereby, is evaporated to the vapor 706. The vapor 706 moves to a location in the heat-transfer pipe 616 (e.g., a cool spot) where it releases heat and condenses (again) to the liquid 704 as generally indicated at the top of the cross-section of FIG. 7. Such movement is driven by the evaporation itself, e.g., expanding vapor moving out of the way, and capillary forces on the liquid 704 within the wick 710. The wick 710 is used to transport the, now condensed, liquid 704 from the cool spot to the hot spot. The wick 710 absorbs the liquid 704 and capillary forces (e.g., capillary action) return the liquid 704 to the hot spot (where the liquid 704 is again evaporated to the vapor 706). When the heat-transfer pipe 616 is properly functioning, the wick 710 remains moist because the wick 710 receives the liquid 704 at approximately the same rate that the liquid 704 evaporates to the vapor 706. Some embodiments of the heat-transfer pipe 616 include the wick 710 while other embodiments exclude the wick 710. The fluid may cycle back and forth between the liquid state and the gaseous state based on the ambient temperature in which the heat-transfer device is located. In some examples, the heat-transfer pipe 616 can cool the heat-generating component from a temperature at or above its maximum safe temperature down to a temperature within its normal operating temperature range. While the heat-transfer pipe 616 is described with respect to passive, evaporative cooling, other embodiments may utilize active (e.g., pumped) liquid cooling.

Figure 8:
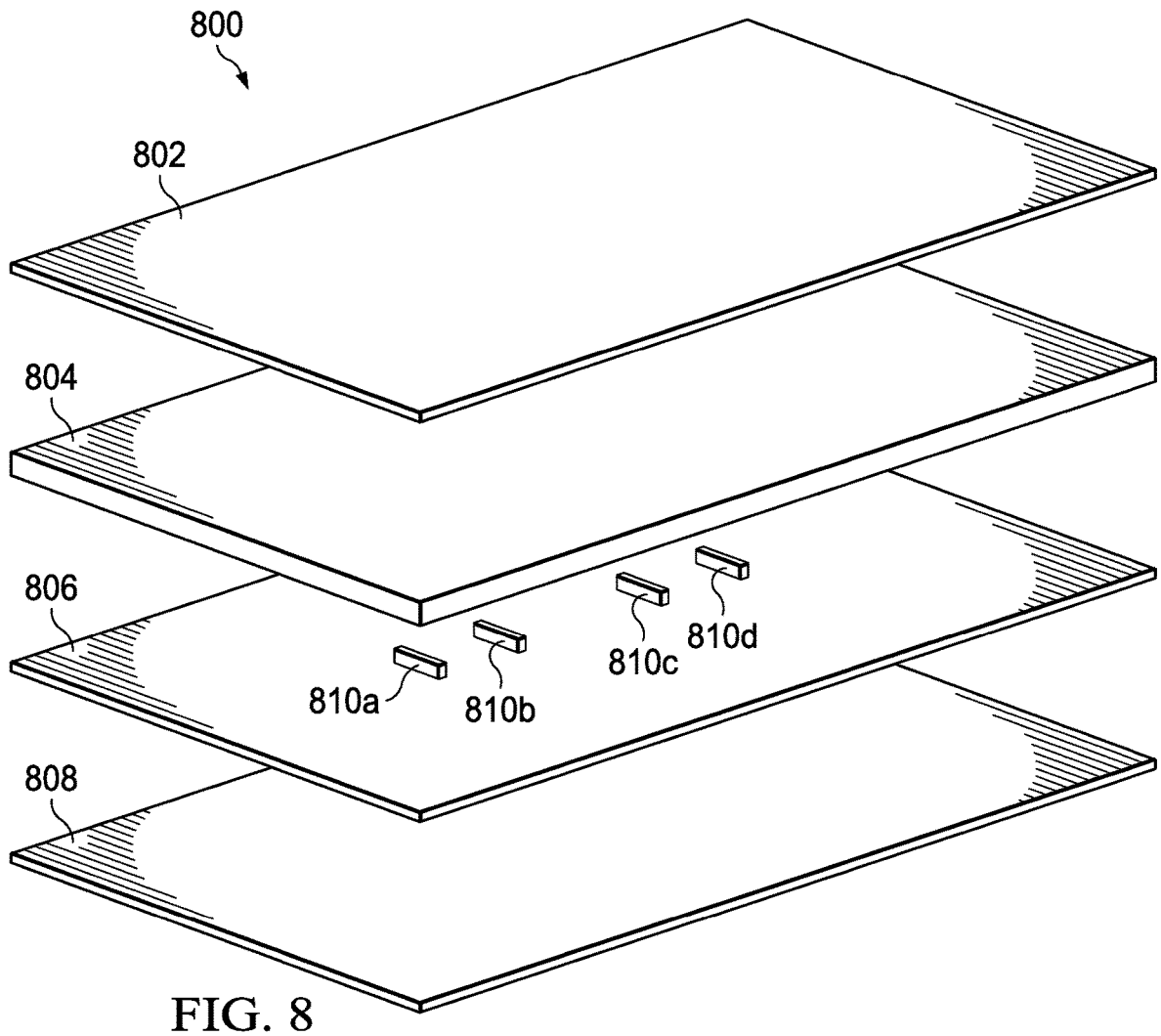
FIG. 8 is an exploded view of a component configured to couple to a device, according to some embodiments of the present disclosure.

FIG. 8 is an exploded view of a component 800 configured to couple to a device, according to some embodiments of the present disclosure. The component 800 may be representative of the cover 104 of FIG. 1, the stand cover 208 of FIG. 2B, the fan dock 216 of FIG. 2C, the housings 310 or 306 (of the FIGS. 3A and 3B), or any other component that may be attached to, coupled to, or selectively in contact with the device. The component 800 includes layers 802, 804, 806, and 808, and magnets 810a, 810b, 810c, and 810d. The magnets 810a, 810b, 810c, and 810d are referred to collectively as the magnets 810. When the component 800 is assembled, the layers 802, 804, 806, and 808 attached to one another. The layer 802 may be an outer layer of the component 800. The layer 802 is a visible exterior of the cover and, therefore, may be decorative. For example, the layer 802 may be a decorative and/or protective layer that is visible when the component 800 is assembled. In some examples, the layer 802 includes polyurethane, leather, plastic, combinations thereof, or other materials. For safety and comfort of users, the layer 802 is an insulative layer that inhibits the heat transferred by the layers 804, 806, and 808 from reaching the surface of the component 800, where it could potentially come in direct contact with the users. The layers 804, 806, and 808 may be conductive layers. Each of the layers may include a different material makeup. For example, the layer 804 may include graphite, the layer 806 may include a copper alloy foil, and the layer 808 may include a conductive rubber material. The magnets 810 are attached between the layers 804 and 806. The magnets 810 are operable to attract corresponding magnets on a device to which the component 800 is attached and can initiate movement of a heat-transfer device on the device, as will be discussed in further detail below.

Figure 9A:
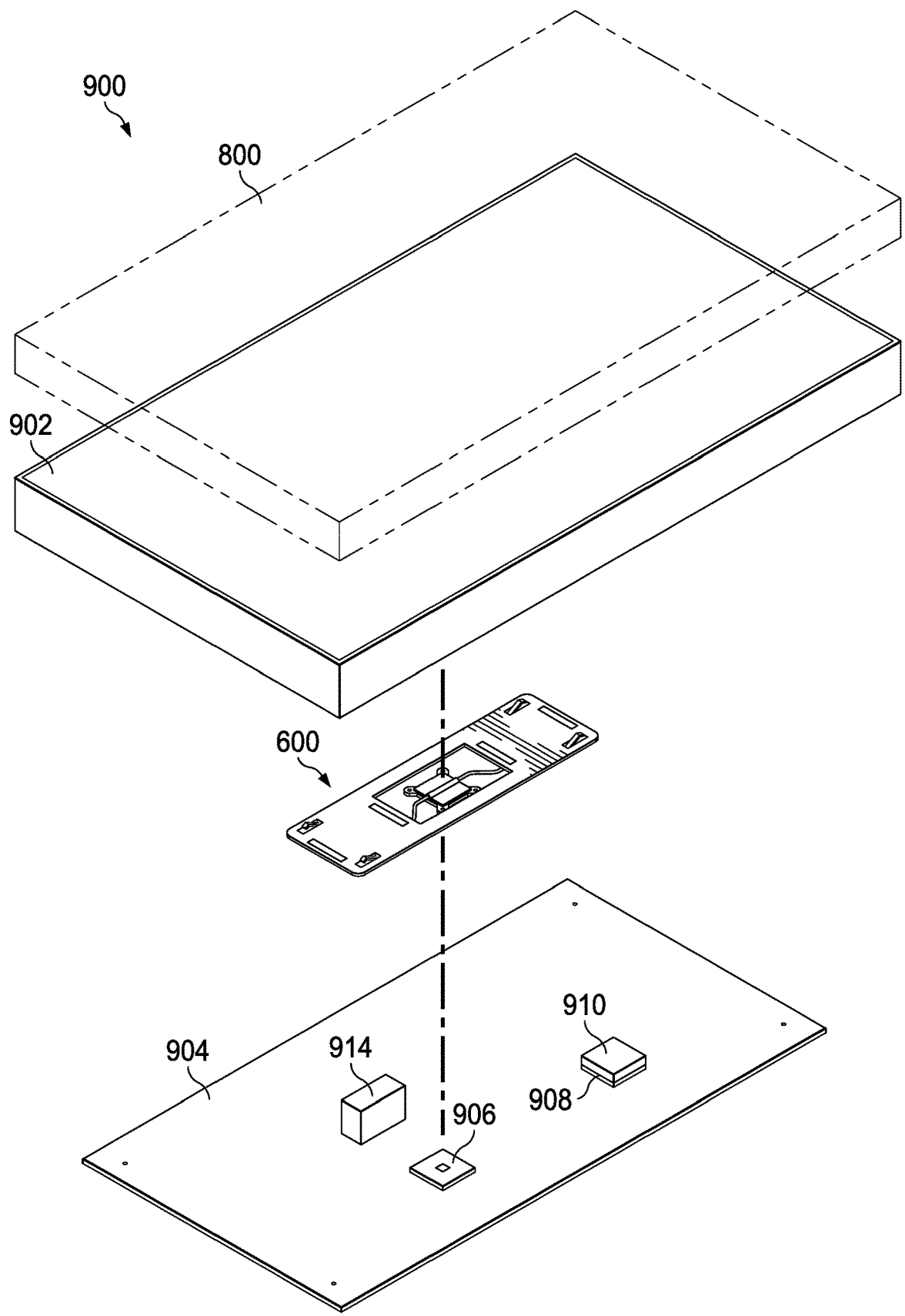
FIGS. 9A and 9B illustrate views of a movable heat-transfer device installed on a circuit board, according to some embodiments of the present disclosure.
Figure 9B:
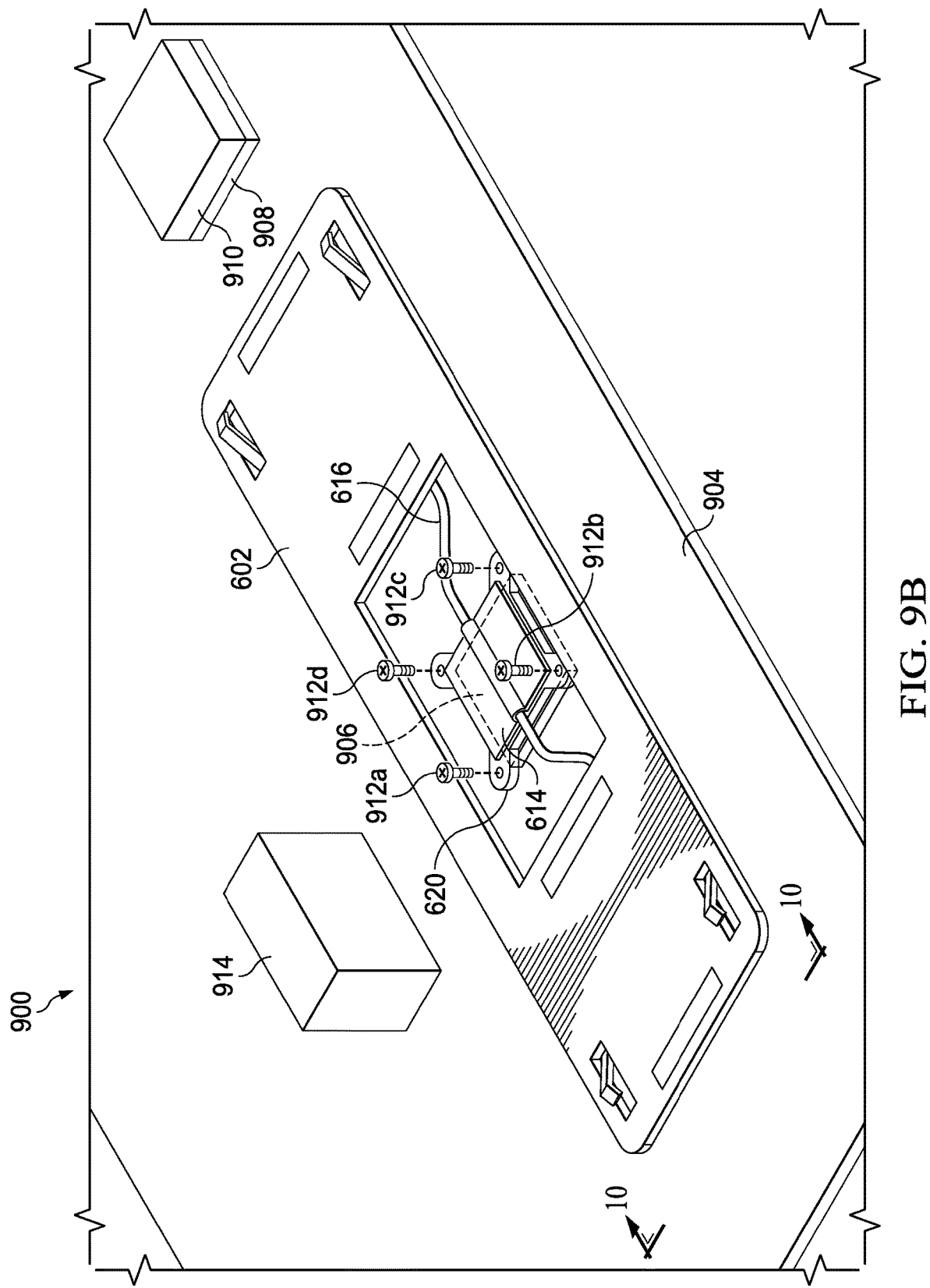

FIGS. 9A and 9B illustrate views of system 900, which includes the component 800 of FIG. 8, a housing 902, the heat-transfer device 600 of FIGS. 6A-6E, and a circuit board 904. FIG. 9A illustrates an exploded view of the system 900. The circuit board 904 includes a processor 906 and chips 914 and 908. A thermal interface material (TIM) 910 fills a gap between the chip 908 and the housing 902. The TIM 910 conducts thermal energy from the chip 908 to the housing 902.

FIG. 9B illustrates a partially assembled view of the system 900. Fasteners 912*a*, 912*b*, 912*c*, and 912*d* attached the plate 620 to the circuit board 904 and hold the plate 620 in contact with the processor 906. Because the heat-transfer device 600 is movable, the heat-transfer device 600 and the chip 914 are separated by a lateral gap to enable lateral movement of the heat spreader 602 as the heat-transfer pipe 616 rotates from a first position to a second position in various configurations of the heat-transfer device 600.

Figure 10A:
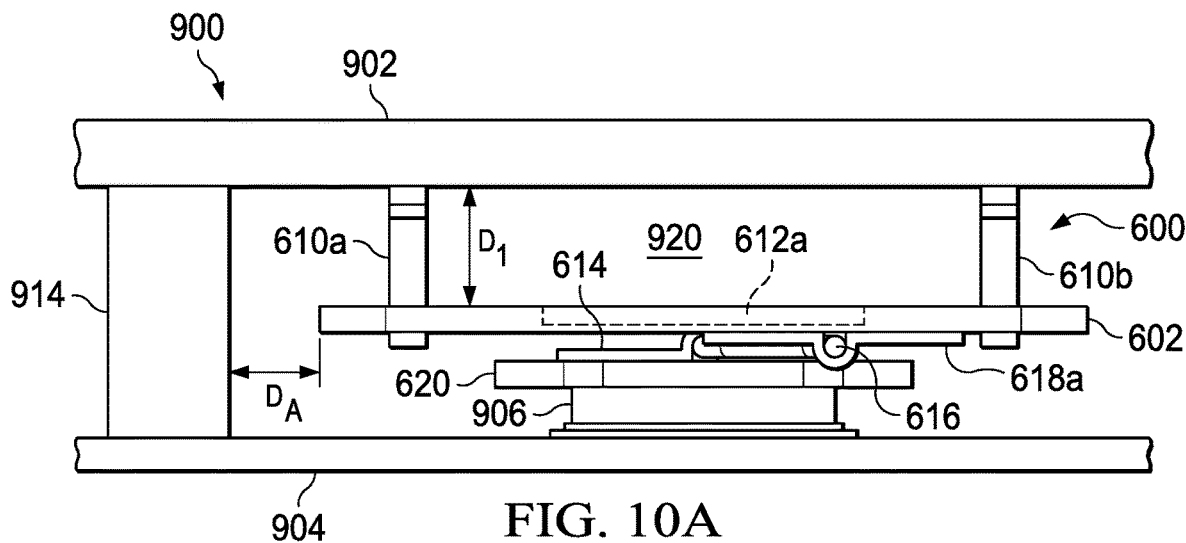
FIGS. 10A, 10B, and 10C illustrate various configurations of a movable heat-transfer device, according to some embodiments of the present disclosure.
Figure 10B:
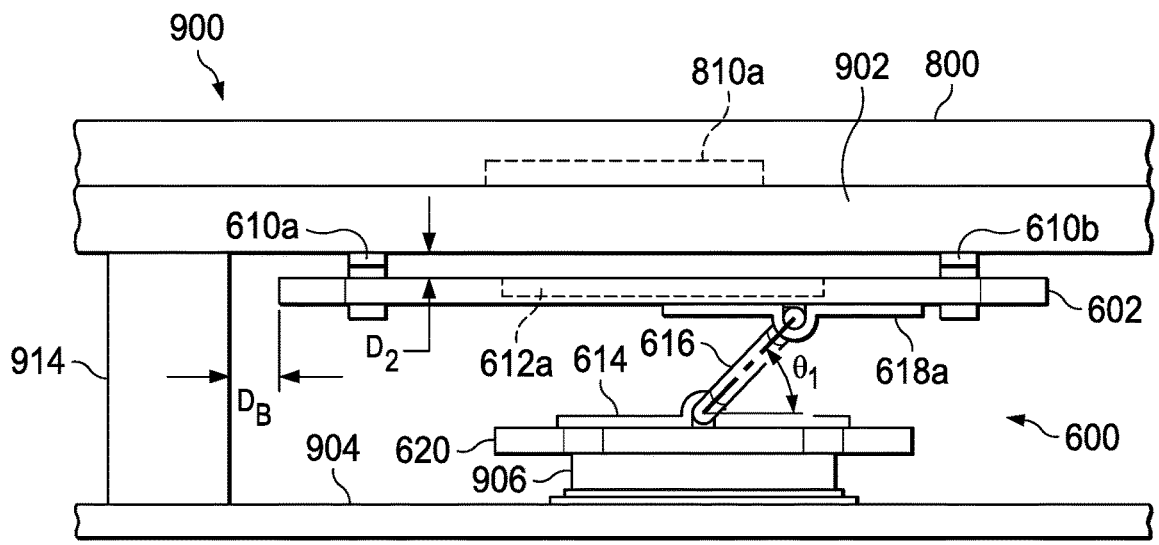
Figure 10C:
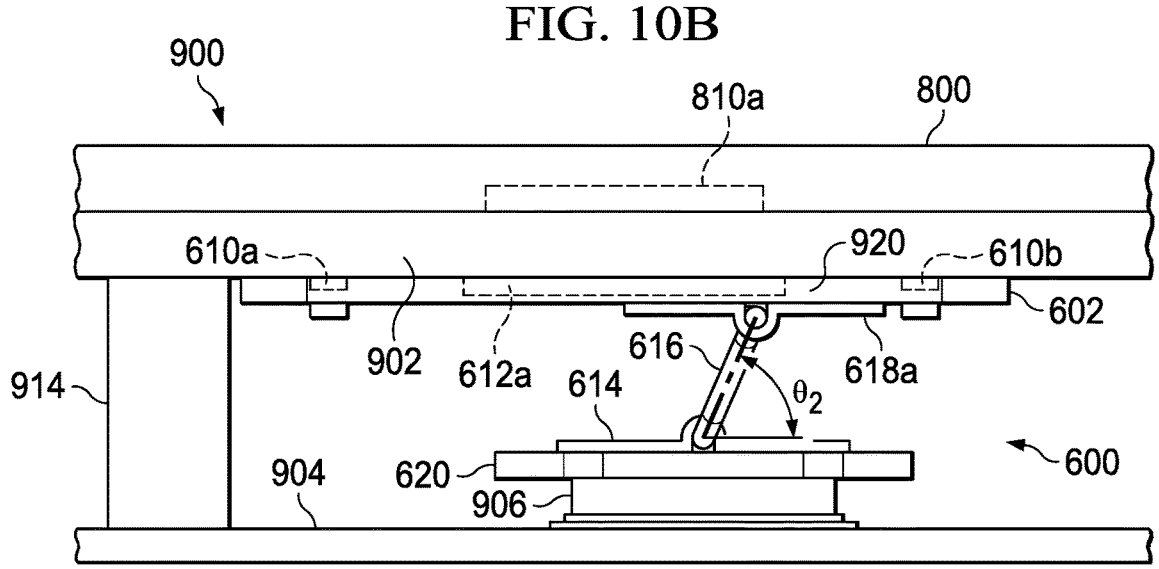

FIGS. 10A, 10B, and 10C illustrate various configurations of the heat-transfer device 600, according to some embodiments of the present disclosure. Each of the FIGS. 10A, 10B, and 10C is side view of the system 900 during operation, as generally indicated by the arrows labeled "10" in the FIG. 9B. The FIGS. 10A, 10B, and 10C show, among other things, rotation of the heat-transfer pipe 616 between a first orientation and a second orientation and simultaneous movement of the heat spreader 602 from a first position to a second position to cool the processor 906 based on attachment of the component 800. FIG. 10A illustrates the system 900 in a first configuration. FIG. 10C illustrates the system 900 in a second configuration. FIG. 10B illustrates the system 900 in transition between the first configuration and the second configuration, such as from the first configuration to the second configuration or vice versa.

FIG. 10A illustrates the system 900 in the first configuration. The component 800 is absent and is not nearby the housing 902. The heat-transfer pipe 616 is at the first orientation and the heat spreader 602 is at the first position based on the forces generated by the springs 610 and the component 800 being decoupled from the housing 902. The first orientation of the heat-transfer pipe 616 is approximately an angle of 0°, zero degrees. The first position of the heat spreader 602 is lowered near the processor 906. The springs 610 force the heat spreader 602 away from the housing 902 and create a gap 920 of distance $D_1$. Because the magnets 612 are not proximate the corresponding magnets 810 in the component 800, the magnets 612 and 810 do not pull the heat spreader 602 toward the housing 902 and do not compress the springs 610. In addition, the heat spreader 602 and the chip 914 are separated by a lateral gap, which in the first configuration measures a distance $D_A$. The lateral gap enables lateral movement of the heat spreader 602 as the heat-transfer pipe 616 rotates.

FIG. 10B illustrates the system 900 in transition between the first configuration and the second configuration. The component 800 is nearby the housing 902 such as approaching and or retreating relative to the housing 902. The heat-transfer pipe 616 is at an acute angle, angle $\theta_1$, and the heat spreader 602 is at an intermediate position based on the component 800. The angle $\theta_1$ is greater than 0°. Attractive magnetic forces generated between the magnets 810 on the component 800 and the magnets 612 on the heat-transfer device 600 begin to overcome forces generated by the springs 610 on the heat-transfer device 600. The magnetic forces overcoming the spring forces moves the heat spreader 602 toward the housing 902 and rotates the heat-transfer pipe 616 upward (e.g., from the zero degrees to the angle $\theta_1$). The springs 610 are partial compressed and the gap 920 between the heat spreader 602 and the housing 902 is a distance $D_2$. The distance $D_2$ is less than the distance $D_2$ of FIG. 10A. As the heat spreader 602 moves up and the heat-transfer pipe 616 rotates up, the heat spreader 602 moves laterally. The lateral gap, during transition as shown in FIG. 10B, measures a distance $D_B$. The distance $D_B$ is less than the distance $D_A$ of the first configuration, as shown in FIG. 10A. While the foregoing description relates to a transition from the first configuration to the second configuration, those of skill in the art will readily appreciate that the process is similar when transitioning from the second configuration to the first configuration. One difference is that the spring forces eventually overcome the magnetic forces as the component 800 is detached from the housing 902.

FIG. 10C illustrates the system 900 in the second configuration. The component 800 is coupled to the housing 902. The heat-transfer pipe 616 is at a second orientation, angle $\theta_2$, and the heat spreader 602 is at a second position based on the forces generated by the magnets 612 and 810 and the component 800 being coupled to the housing 902. The angle $\theta_2$ is larger than the angle $\theta_1$ of the FIG. 10B. The second position of the heat spreader 602 is raised and in contact with the housing 902. Attractive magnetic forces generated between the magnets 810 on the component 800 and the magnets 612 on the heat-transfer device 600 overcome forces generated by the springs 610 on the heat-transfer device 600 and close the gap 920. Because the magnets 612 are proximate the corresponding magnets 810 in the component 800, the magnets 612 and 810 have pulled the heat spreader 602 toward and in contact with the housing 902 and compressed the springs 610. The springs 610*a*, 610*b*, 104*c*, and 610*d* are compressed and nest within the openings 604*a*, 604*b*, 604*c*, and 604*d* (see FIGS. 6A-6E), respectively, which enables the springs 610 to rest flush with a surface of the heat spreader 602. In addition, the lateral movement of the heat spreader 602 has closed the lateral gap between the heat spreader 602 and the chip 914.

Figure 11:
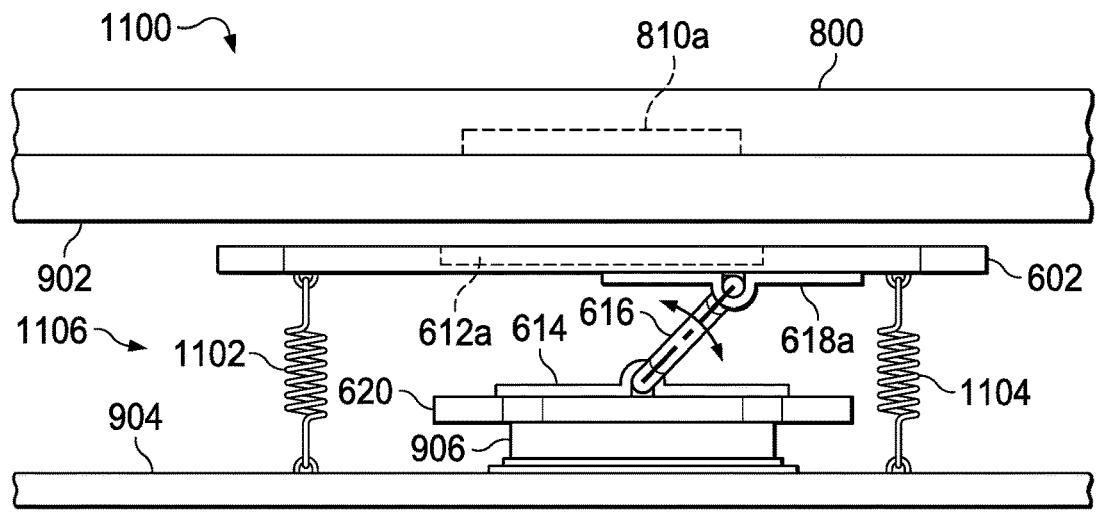
FIGS. 11, 12, 13, 14A, 14B, 15A, and 15B illustrate various movable heat-transfer devices, according to some embodiments of the present disclosure.
Figure 12:
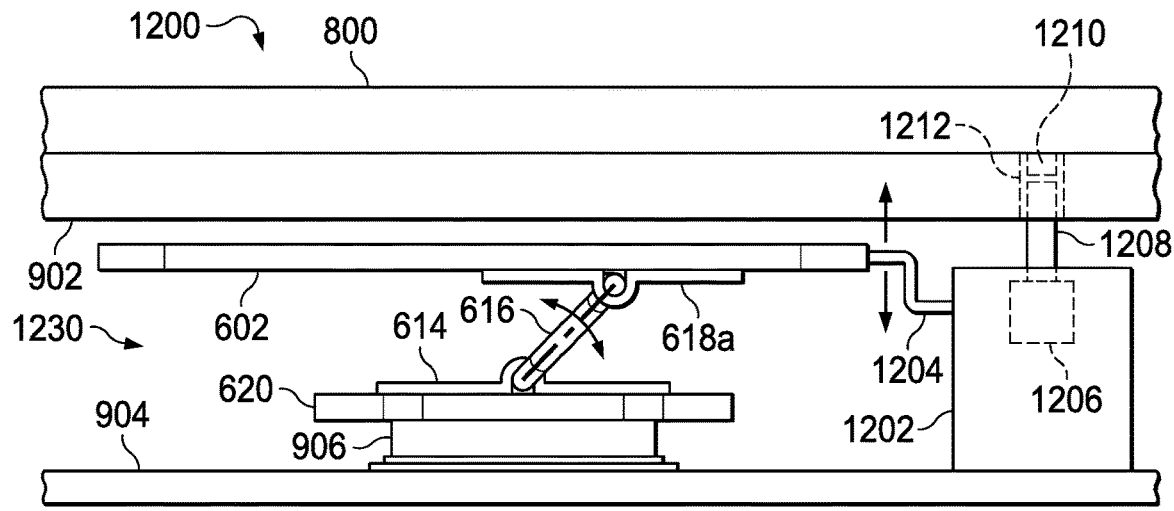
Figure 13:
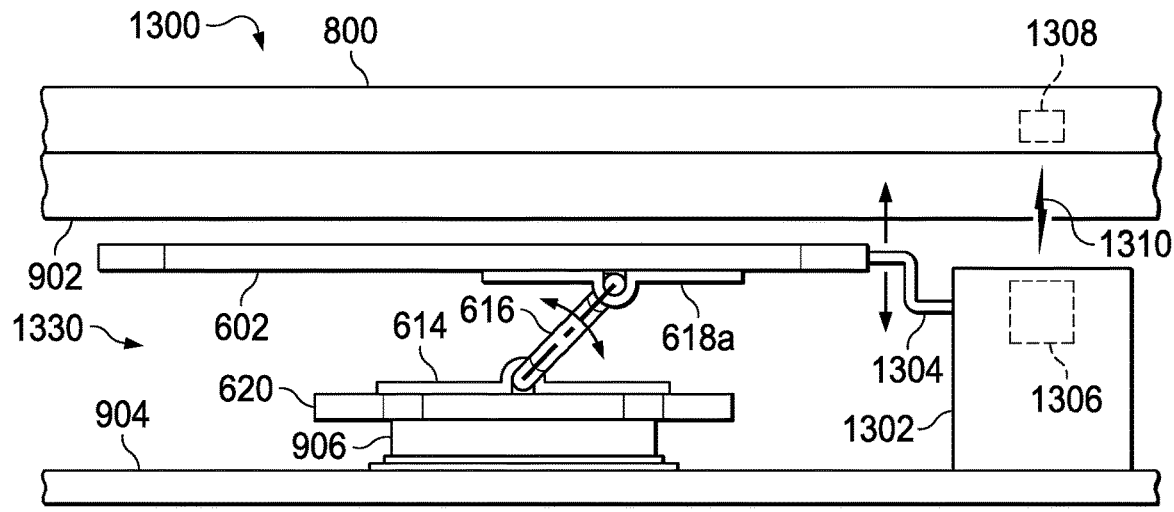

FIGS. 10A, 10B, and 10C depict the heat-transfer device 600 directly contacting the processor 906 (e.g., the heat-generating component) and the housing 902. Embodiments of the present disclosure are not limited to such configurations. In some embodiments, one or more intermediate materials lie between a heat-transfer device and the heat-generating component and/or the housing, e.g., to facilitate physically and/or thermally coupling the heat-transfer device, the heat-generating component, and/or the housing to one another. Moreover, the teachings of the present disclosure are equally applicable to heat-transfer devices of various sizes, shapes, and orientations while deployed (e.g., vertical, horizontal, diagonal, upright, upside down, and the like). FIGS. 11, 12, and 13 some variations of a heat-transfer device, according to some embodiments of the present disclosure.

FIG. 11 illustrates a system 1100, which includes a heat-transfer device 1106, according to some embodiments of the present disclosure. The system 1100 includes the component 800 of FIG. 8; the housing 902, the circuit board 904, and the processor 906 of FIGS. 9A and 9B; and the heat-transfer device 1106. The description of the component 800, the housing 902, the circuit board 904, and the processor 906 are not repeated here only for the sake of brevity.

FIG. 11 illustrates a view and a configuration of the system 1100 similar to the view and the configuration of system 900 illustrated in FIG. 10B.

The heat-transfer device 1106 includes components and may operate as described with respect to the heat-transfer device 600 of FIGS. 6A-6E, 7A-7B, 9A, 9B, 10A, 10B, and 10C. The description is not repeated here only for the sake of brevity. Each of the heat-transfer devices 600 and 1106 utilizes springs and magnets to move between various configurations (e.g., positions of the heat spreader 602 and orientations of the heat-transfer pipe 616). A difference between the heat-transfer devices 600 and 1106 is a type and position of the springs. The heat-transfer device 600 includes the springs 610, which are compression springs that exert a force to push the heat spreader 602 and the housing 902 away from one another. The springs 610 are substantially planar, are attached to the heat spreader 602, and are not attached to the housing 902. The heat-transfer device 1106 includes springs 1102 and 1104, which are tension springs that exert a force to pull the heat spreader 602 toward the circuit board 904. The springs 1102 and 1104 are coil springs and are attached to both the heat spreader 602 and the circuit board 904. When the component 800 is attached, attractive magnetic forces generated between the magnets 810 on the component 800 and the magnets 612 on the heat-transfer device 600 begin to overcome forces generated by the springs 1102 and 1104 on the heat-transfer device 1106. The magnetic forces overcoming the spring forces moves the heat spreader 602 toward the housing 902 and rotates the heat-transfer pipe 616 upward. As the heat spreader 602 moves up, the springs 1102 and 1104 are stretched beyond their resting length and begin to store energy based on being stretched. When the component 800 is detached, the attractive magnetic forces generated between the magnets 810 and 612 are released, at which point the springs 1102 and 1104 contract, releasing their stored energy, and pull the heat spreader 602 toward the circuit board 904. While each of the heat-transfer devices 600 and 1106 utilizes the springs to facilitate movement, the manner in which the springs operate is different.

FIG. 12 illustrates a system 1200, which includes a heat-transfer device 1230, according to some embodiments of the present disclosure. The system 1200 includes the component 800 of FIG. 8; the housing 902, the circuit board 904, and the processor 906 of FIGS. 9A and 9B; and the heat-transfer device 1230. The description of the component 800, the housing 902, the circuit board 904, and the processor 906 are not repeated here only for the sake of brevity. FIG. 12 illustrates a view and a configuration of the system 1200 similar to the view and the configuration of the system 900 illustrated in FIG. 10B. The heat-transfer device 1230 includes components and may operate as described with respect to the heat-transfer device 600 of FIGS. 6A-6E, 7A-7B, 9A, 9B, 10A, 10B, and 10C. The description is not repeated here only for the sake of brevity.

A difference between the heat-transfer devices 600 and 1230 is the manner of actuating of the heat spreader 602 and the heat-transfer pipe 616. The heat-transfer device 600 utilizes a passive actuator comprising the springs 610 and the magnets 612, which is actuated by the magnets 810 on the component 800. Such a passive actuator does not directly utilize power (e.g., no electrical current) to actuate the heat spreader 602 and the heat-transfer pipe 616. The heat-transfer device 1230 utilizes an actuator 1202, which is actuated by a pin 1210 on the component 800 and a pin 1208 on the housing 902. The actuator 1202 is active and utilizes power for its operation. The actuator 1202 is coupled to the circuit board 904 and draws power from a power source coupled thereto. The actuator 1202 includes an arm 1204 and a switch 1206. The arm 1204 is attached to the heat spreader 602 and is operable to move the heat spreader 602 in a reciprocating motion. The arm 1204 may include one or more telescopic components to enable lateral movement of the heat spreader 602 as it moves vertically. In some examples, the arm 1204 is a crank. The pin 1210 protrudes from the component 800. The pin 1208 is movably coupled within an opening 1212 in the housing 902. The pin 1208 is configured to toggle the switch 1206 on the actuator 1202. When the component 800 is attached, the pin 1210 pushes the pin 1208 into contact with the switch 1206. The contact depresses a portion of the switch 1206, which toggles the switch 1206 from a first position to a second position. The actuator 1202 utilizes the arm 1204 to move the heat spreader 602 and the heat-transfer pipe 616 to a first configuration, e.g., similar to FIG. 10A, based on the switch 1206 being in the second position. When the component 800 is detached, the pin 1210 releases the pin 1208, which moves up and disconnects from the switch 1206. The portion of the switch 1206 rises based on the disconnection of the pin 1208, which toggles the switch 1206 from the second position to the first position. The actuator 1202 utilizes the arm 1204 to move the heat spreader 602 and the heat-transfer pipe 616 to a second configuration, e.g., similar to FIG. 10C, based on the switch 1206 being in the first position.

FIG. 13 illustrates a system 1300, which includes a heat-transfer device 1330, according to some embodiments of the present disclosure. The system 1300 includes the component 800 of FIG. 8; the housing 902, the circuit board 904, and the processor 906 of FIGS. 9A and 9B; and the heat-transfer device 1330. The description of the component 800, the housing 902, the circuit board 904, and the processor 906 are not repeated here only for the sake of brevity. The heat-transfer device 1330 includes some components and may operate as described with respect to the heat-transfer device 1230 of FIG. 12. The description is not repeated here only for the sake of brevity. The component 800 includes an activation element 1308. The actuator 1302 includes an arm 1304 and a sensor 1306. The sensor 1306 is operable to detect whether the housing 902 and the component 800 are coupled based on detecting presence or absence of the activation element 1308. The activation element 1308 is operable to activate the actuator 1302 based on proximity between the activation element 1308 and the sensor 1306.

A difference between the heat-transfer devices 1230 and 1330 is the manner of activating an actuator. The actuator 1202 on the heat-transfer device 1230 is activated based on a mechanical action on the switch 1206. The actuator 1302 on the heat-transfer device 1330 is activated based the sensor detecting presence of the activation element 1308. When the component 800 is attached, the sensor 1306 detects presence of the activation element 1308, as generally indicated by 1310. The actuator 1302 utilizes the arm 1304 to move the heat spreader 602 and the heat-transfer pipe 616 to a first configuration (e.g., similar to FIG. 10A) based on the sensor 1306 detecting presence of the activation element 1308. When the component 800 is detached, the sensor 1306 detects absence of the activation element 1308, e.g., based on not detecting presence of the activation element 1308. The actuator 1302 utilizes the arm 1304 to move the heat spreader 602 and the heat-transfer pipe 616 to a second configuration (e.g., similar to FIG. 10C) based on the sensor 1306 detecting absence of the activation element 1308. In some examples, the activation element 1308 includes a magnet and the sensor 1306 includes a Hall sensor. In still some examples, the activation element 1308 includes a passive radio frequency identification (RFID) tag and the sensor 1306 includes an active RFID tag. The teachings of the present disclosure contemplate the activation element 1308 and the sensor 1306 being embodied in various devices, sensors, or other hardware.

It is noted that while FIG. 13 depicts the sensor 1306 within the actuator 1302, the sensor 1306 may be located anywhere within the housing 902. In some examples, the sensor 1306 is outside of the actuator 1302 and coupled to the circuit board 904. In addition, the sensor 1306 may be utilized by other components in the system 1300. For example, the processor 906 may utilize output from the sensor 1306 to adaptively adjust its clock rate, e.g., between a normal clock rate, a low clock rate, and a maximum clock rate, or fractions thereof. In such embodiments, the processor 906 is operable increasing its clock rate based on the sensor 1306 detecting that the component 800 is attached to the housing 902. The processor 906 may switch between two or more performance modes based on the detection by the sensor 1306. For example, in a first performance mode, the processor 906 operates at a first clock rate such as about 20-70 percent of its maximum clock rate based on the sensor 1306 detecting that the component 800 is not attached. In a second performance mode, the processor 906 operates at a second clock rate such as about 80-100 percent of its maximum clock rate based on the sensor 1306 detecting that the component 800 is attached.

While some heat-transfer devices of the present disclosure are illustrated having a single heat-transfer pipe that cools a single heat-generating component, embodiments of the present disclosure are not limited to such a configuration. Some heat-transfer devices of the present disclosure include a single heat-transfer pipe that simultaneously cools multiple heat-generating components.

Figure 14A:
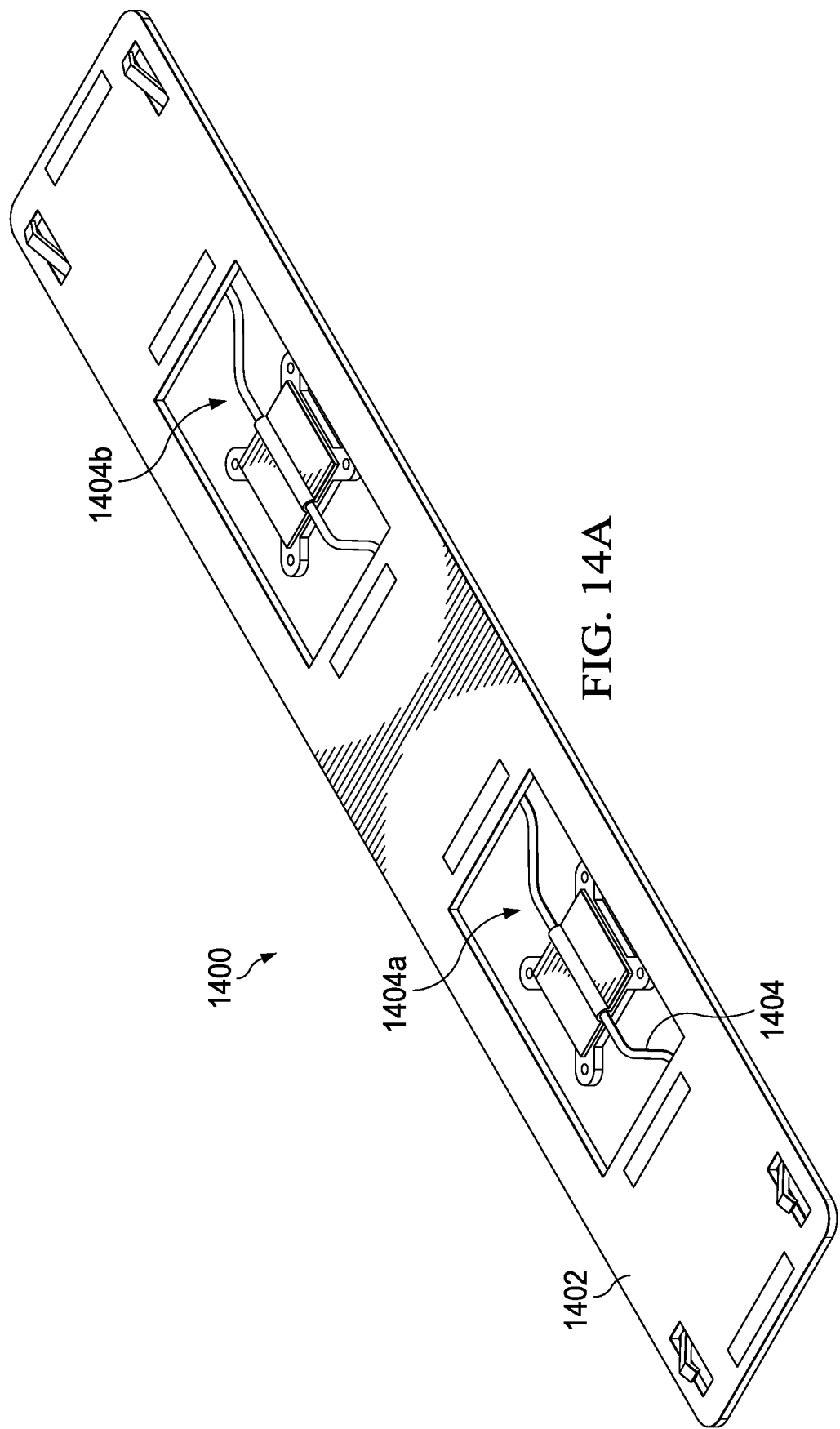
Figure 14B:
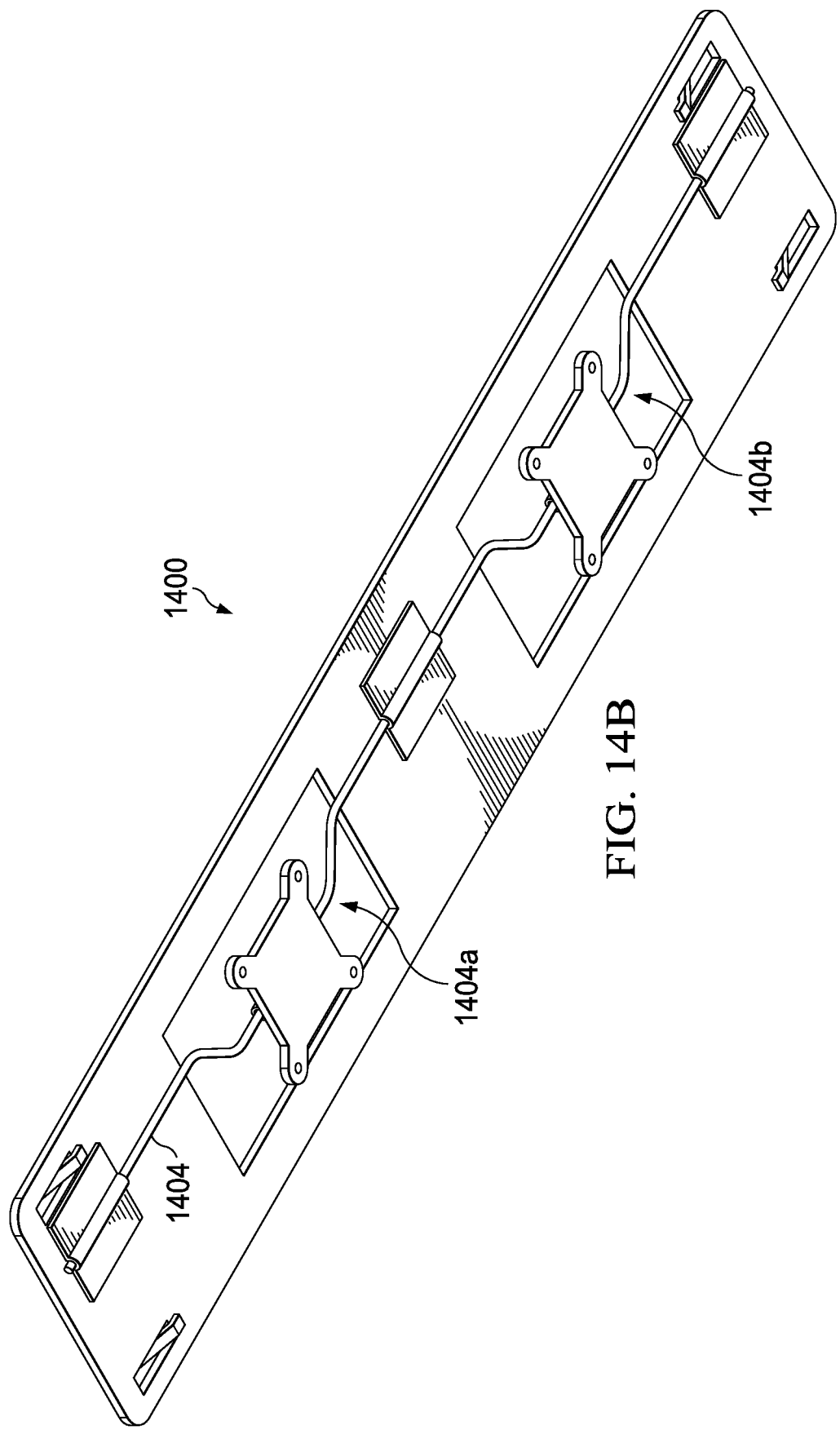

FIGS. 14A and 14B illustrate a heat-transfer device 1400, which can utilize a single heat-transfer pipe to simultaneously cool multiple heat-generating components, according to some embodiments of the present disclosure. The heat-transfer device 1400 includes components and may operate as described with respect to the heat-transfer device 600 of FIGS. 6A-6E, 7A-7B, 9A, 9B, 10A, 10B, and 10C. The description of many like components is not repeated here only for the sake of brevity. A difference between the heat-transfer devices 600 and 1400 is the number of eccentric portions on the heat-transfer pipe and the number of heat-generating components that may be simultaneously cooled using the heat-transfer pipe. The heat-transfer device 600 includes the heat-transfer pipe 616, which includes a single eccentric portion (e.g., 616*b*). The heat-transfer device 1400 includes the heat-transfer pipe 1404, which includes multiple eccentric portions 1404*a* and 1404*b*. Each of the eccentric portions 1404*a* and 1404*b* may be coupled by brackets to a different heat-generating component. When, for example, the heat-generating components are different heights, a TIM is placed between the bracket and the heat-generating component such that each bracket rests at a same elevation. Maintaining the same elevation enables each of the eccentric portions 1404*a* and 1404*b* to have a same amount of eccentricity, such as the distance $D_E$ of the FIG. 6A.

While some heat-transfer devices of the present disclosure are illustrated having a single heat-transfer pipe that cools a single heat-generating component, embodiments of the present disclosure are not limited to such a configuration. Some heat-transfer devices of the present disclosure include multiple heat-transfer pipes that simultaneously cool a single heat-generating component.

Figure 15A:
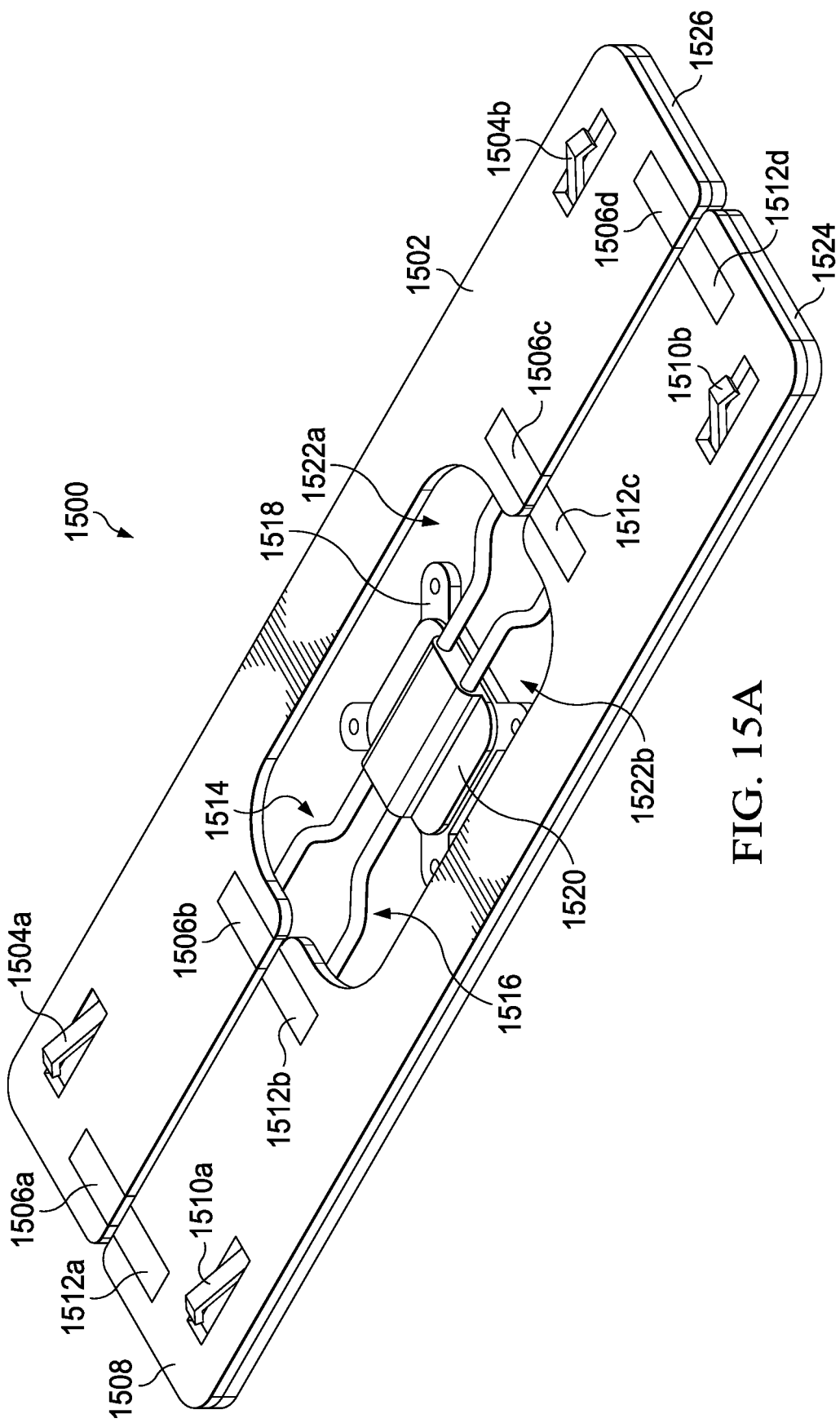
Figure 15B:
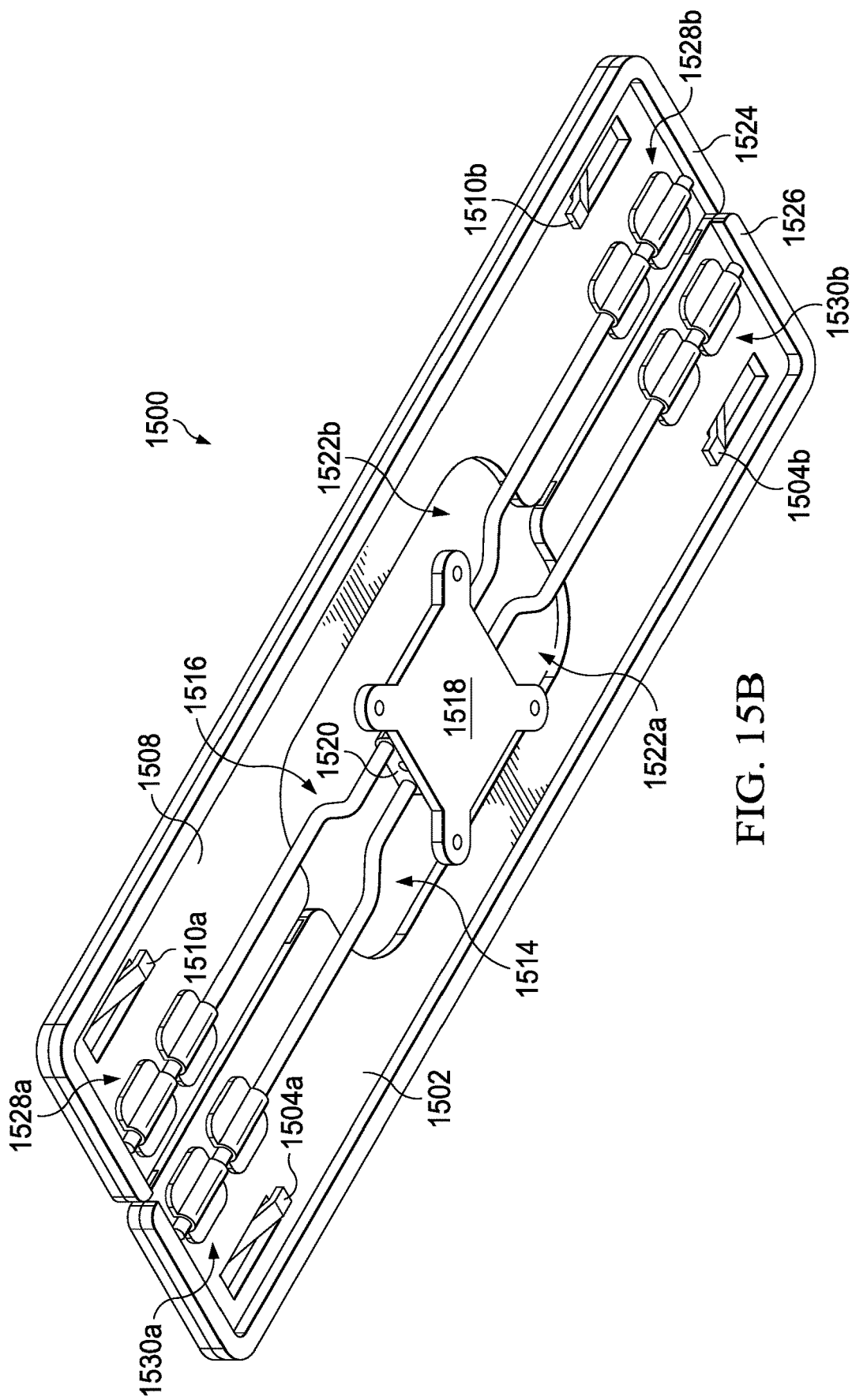

FIGS. 15A and 15B illustrate a heat-transfer device 1500, which can utilize multiple heat-transfer pipes to simultaneously cool a single heat-generating component, according to some embodiments of the present disclosure. FIG. 15A illustrates an isometric view from above the heat-transfer device 1500. FIG. 15B illustrates an isometric view from below the heat-transfer device 1500. The heat-transfer device 1500 includes heat spreaders 1508 and 1502, magnets 1506*a*, 1506*b*, 1506*c*, 1506*d*, 1512*a*, 1512*b*, 1512*c*, and 1512*d*, springs 1504*a*, 1504*b*, 1510*a*, and 1510*b*, a heat-transfer pipes 1514 and 1516, brackets 1520, 1528*a*, 1528*b*, 1530*a*, and 1530*b*, a plate 1518, and seals 1524 and 1526. The heat-transfer device 1500 includes components and may operate as described with respect to the heat-transfer device 600 of FIGS. 6A-6E, 7A-7B, 9A, 9B, 10A, 10B, and 10C. The description of many like components is not repeated here only for the sake of brevity.

A difference between the heat-transfer devices 600 and 1500 is the that the heat-transfer device 600 includes a single heat spreader and rotatable heat-transfer pipe, while the heat-transfer device 1500 includes multiple heat spreaders 1502 and 1508 and multiple heat-transfer pipes 1514 and 1516, each of which is rotatable. The bracket 1520 attaches both of the heat-transfer pipes 1514 and 1516 to the plate 1518. The heat spreaders 1508 and 1502 (and the heat-transfer pipes 1516 and 1514, respectively) can move independently of one another. In addition, a gap lies between the heat spreaders 1502 and 1508. The gap may be two times as wide as a typical lateral gap, such as two times the distance $D_A$ as illustrated in FIG. 10A, to accommodate the lateral movement of each of the heat spreaders 1502 and 1508.

Another difference between the heat-transfer devices 600 and 1500 is the addition of the seals 1524 and 1526. The seal 1524 is attached to an edge of the heat spreader 1508. The seal 1526 is attached to an edge of the heat spreader 1502. When the heat-transfer device 1500 attached to a heat-generating component, the seals 1524 and 1526 and the heat spreaders 1502 and 1508 form a boundary around the heat-generating component. Each of the seals 1524 and 1526 includes a conductive material operable to shield electromagnetic interference (EMI) from passing between an inside of a cavity defined by the boundary and an outside of the cavity. In some examples, the conductive material includes a rubber such as conductive rubber, silicone such as a conductive silicone, a silicone sponge, or Fluorosilicate sponge, combinations thereof, or any other conductive material. The seals 1524 and 1526 help to keep EMI, e.g., generated by a component within the cavity from reaching components outside of the cavity.

Figure 16A:
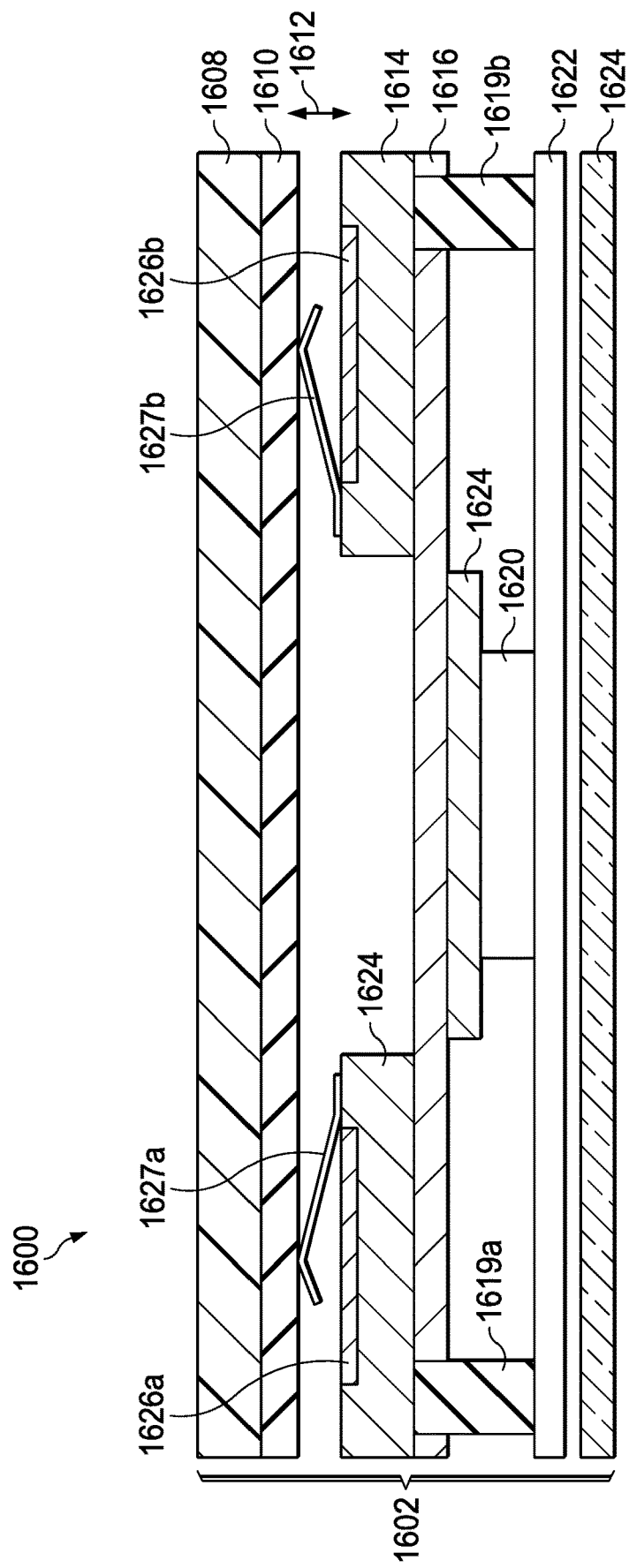
FIGS. 16A, 16B, and 16C illustrate simplified cross-sections of a movable heat-transfer device installed in a mobile device, according to some embodiments of the present disclosure.
Figure 16B:
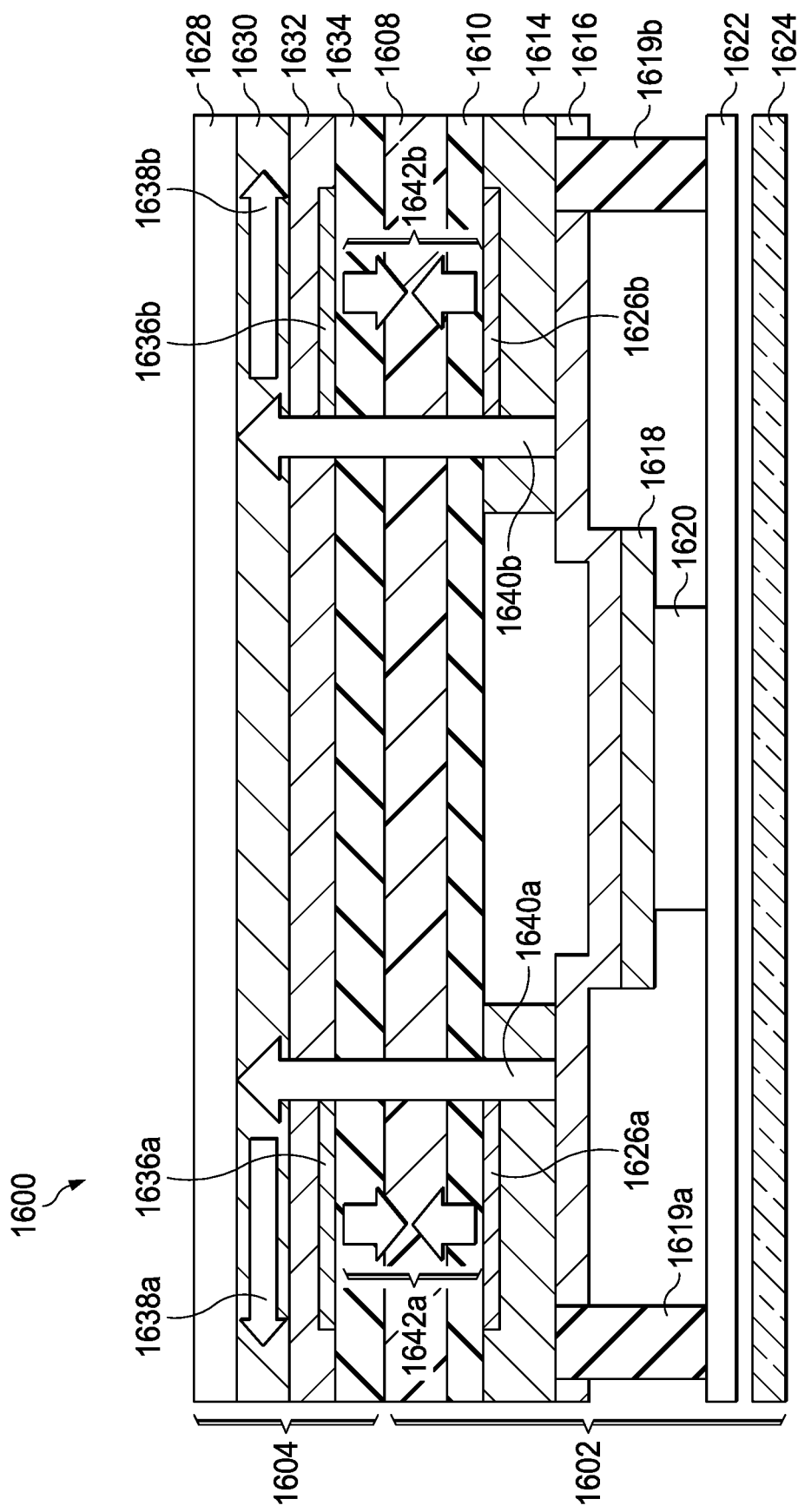
Figure 16C:
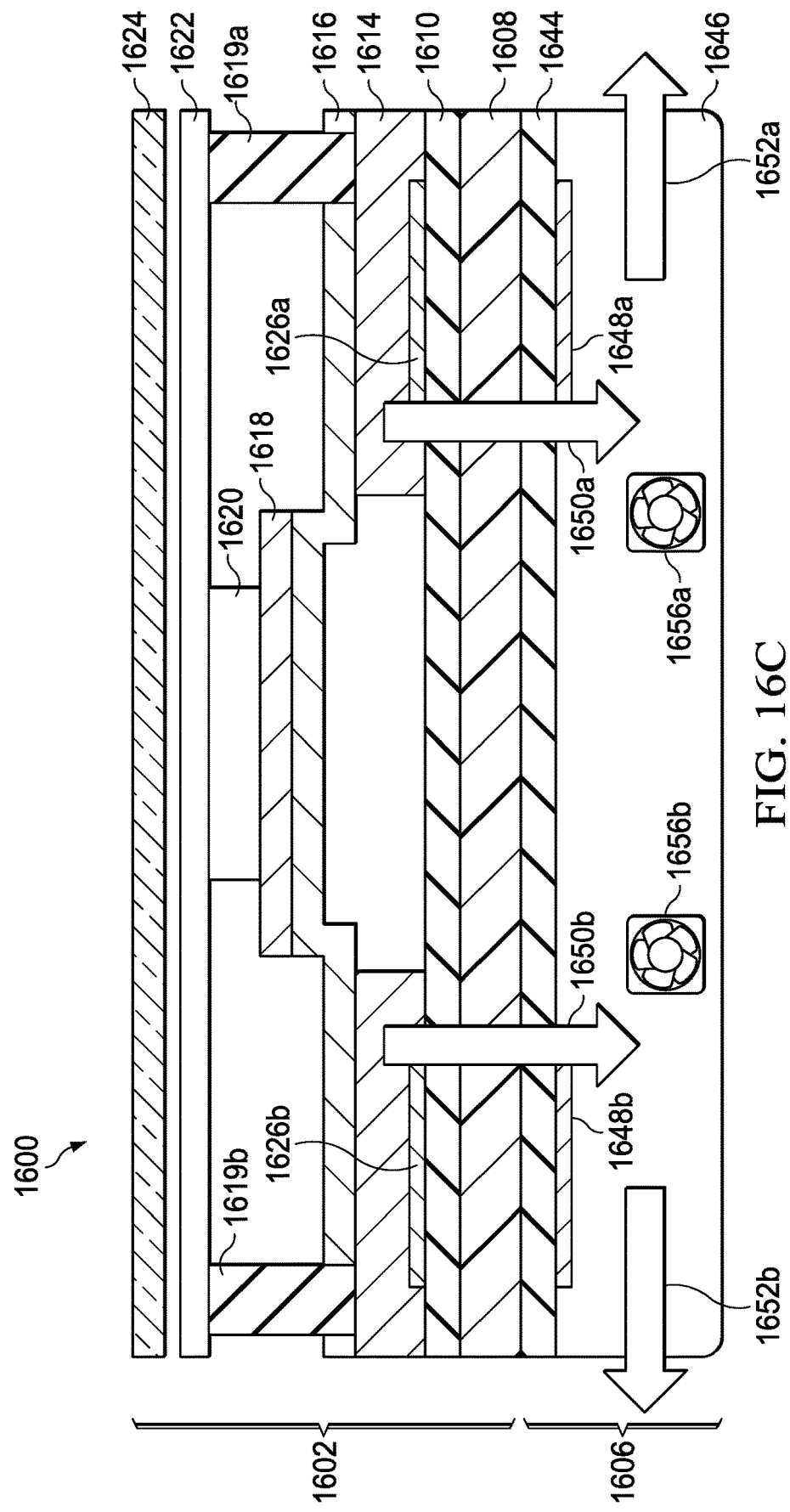

FIGS. 16A, 16B, and 16C illustrate simplified cross-sections of a system 1600 including movable heat-transfer devices installed in various components that can be coupled to a mobile device 1602, according to some embodiments of the present disclosure.

FIG. 16A illustrates a simplified cross-section of a portion of the mobile device 1602. The mobile device 1602 may be a tablet such as the device 202 of FIG. 2A, a mobile phone such as the device 102 of FIG. 1, or any other mobile device. The mobile device 1602 includes a display 1624, a circuit board 1622, a processor 1620, a bracket 1618, seals 1619*a* and 1619*b*, a rotatable heat-transfer pipe 1616, a heat spreader 1614, magnets 1626*a* and 1626*b*, springs 1627*a* and 1627*b*, an air gap 1612, a heat-conducting rubber 1610, and a housing 1608. The display 1624 and the processor 1620 are operably coupled to the circuit board 1622. The circuit board 1622 supports the processor 1620. The seals 1619a and 1619b are attached to the heat spreader 1614 are located between the heat spreader 1614 and the circuit board 1622. The seals 1619a and 1619b form a cavity between the heat spreader 1614 and the circuit board 1622 and shield electromagnetic interference (EMI) from passing between an inside of the cavity to an outside of the cavity. The seals 1619a and 1619b comprise a sponge including, e.g., a silicon-based material capable of shielding EMI. The seals 1619a and 1619b are elastic and can stretch and compress as the heat spreader 1614 moves. The bracket 1618 attaches the rotatable heat-transfer pipe 1616 to the processor 1620 and enables rotation of the rotatable heat-transfer pipe 1616. The rotatable heat-transfer pipe 1616 is also rotatably coupled to the heat spreader 1614. The magnets 1626a and 1626b and the springs 1627a and 1627b are attached to the heat spreader 1614. The heat-conducting rubber 1610 is attached to an inner surface of the housing 1608 and is thermally conductive. Because the heat-conducting rubber 1610 is thermally conductive, it is able to conduct heat from the heat spreader 1614 to the housing 1608.

Collectively, the bracket 1618, the rotatable heat-transfer pipe 1616, the heat spreader 1614, the magnets 1626a and 1626b, and the springs 1627a and 1627b correspond to a movable heat-transfer device that is operable to transfer heat from the processor 1620 to the housing 1608, e.g., as described with respect to FIGS. 10A, 10B, and 10C. FIG. 16A illustrates the heat-transfer device in a first configuration. In the first configuration, the air gap 1612 separates the heat-conducting rubber 1610 and the heat spreader 1614. Advantageously, a component including magnets corresponding to the magnets 1626a and 1626b may be coupled to the mobile device 1602 to reduce the heat associated with (i.e., to cool) the processor 1620 and/or other components within the housing 1608. When such components are coupled the mobile device 1602, the heat-transfer device moves to a second configuration based on attraction between the magnets on the mobile device and magnets in the component. FIGS. 16B and 16C illustrate some embodiments.

FIG. 16B illustrates the heat-transfer device in the second configuration based on a cover 1604 being coupled to the mobile device 1602. The cover 1604 may similar to the cover 104 of FIG. 1, the stand cover 208 of FIG. 2B, the component 800 of the FIG. 8, and/or any other cover. The cover 1604 includes a polyurethane layer 1628, a graphite layer 1630, a copper alloy foil 1632, magnets 1636a and 1636b, and a conductive rubber material 1634. The magnets 1636a and 1636b are attached between the copper alloy foil 1632 and the conductive rubber material 1634.

The cover 1604 couples to the housing 1608 based on attractions 1642a and 1642b between the magnets 1636a and 1626a and the magnets 1636b and 1626b, respectively. In addition, the attractions 1642a and 1642b overcome forces generated by the springs 1627a and 1627b, which compresses the springs 1627a and 1627b, moves the heat spreader 1614 toward the conductive rubber material 1634, and closes the air gap 1612. This movement completes paths of thermal conductivity 1640a and 1640b between the heat spreader 1614 and the cover 1604 via the housing 1608. When attached, the cover 1604 cools the processor 1620 based on receiving heat transferred from the processor 1620 via the paths of thermal conductivity 1640a and 1640b. Such heat is then transferred though the graphite layer 1630 as generally indicated by the arrows 1638a and 1638b.

FIG. 16C illustrates the heat-transfer device in the second configuration based on a fan dock 1606 being coupled to the mobile device 1602. The fan dock 1606 may be an example of the fan dock 216 of the FIG. 2C, the component 800 of the FIG. 8, or any other dock. The fan dock 1606 includes a housing 1646 which includes magnets 1648a and 1648b and fans 1656a and 1656b. It is noted that, in FIG. 16C, the mobile device 1602 is rotated 180 degrees relative to FIG. 16A.

The fan dock 1606 couples to the housing 1608 based on attraction between the magnets 1648a and 1626a and the magnets 1648b and 1626b, respectively. In addition, the attraction overcomes the forces generated by the springs 1627a and 1627b, which compresses the springs 1627a and 1627b and moves the heat spreader 1614 toward the conductive rubber material 1634. This movement completes paths of thermal conductivity 1650a and 1650b between the heat spreader 1614 and the cover 1604 via the housing 1608. When attached, the fan dock 1606 cools the processor 1620 based on receiving heat transferred from the processor 1620 via the paths of thermal conductivity 1650a and 1650b. The fan dock 1606 utilizes the fans 1656a and 1656b to move air near the mobile device 1602 and transfer the heat from the processor 1620 to the ambient air.

Figure 17A:
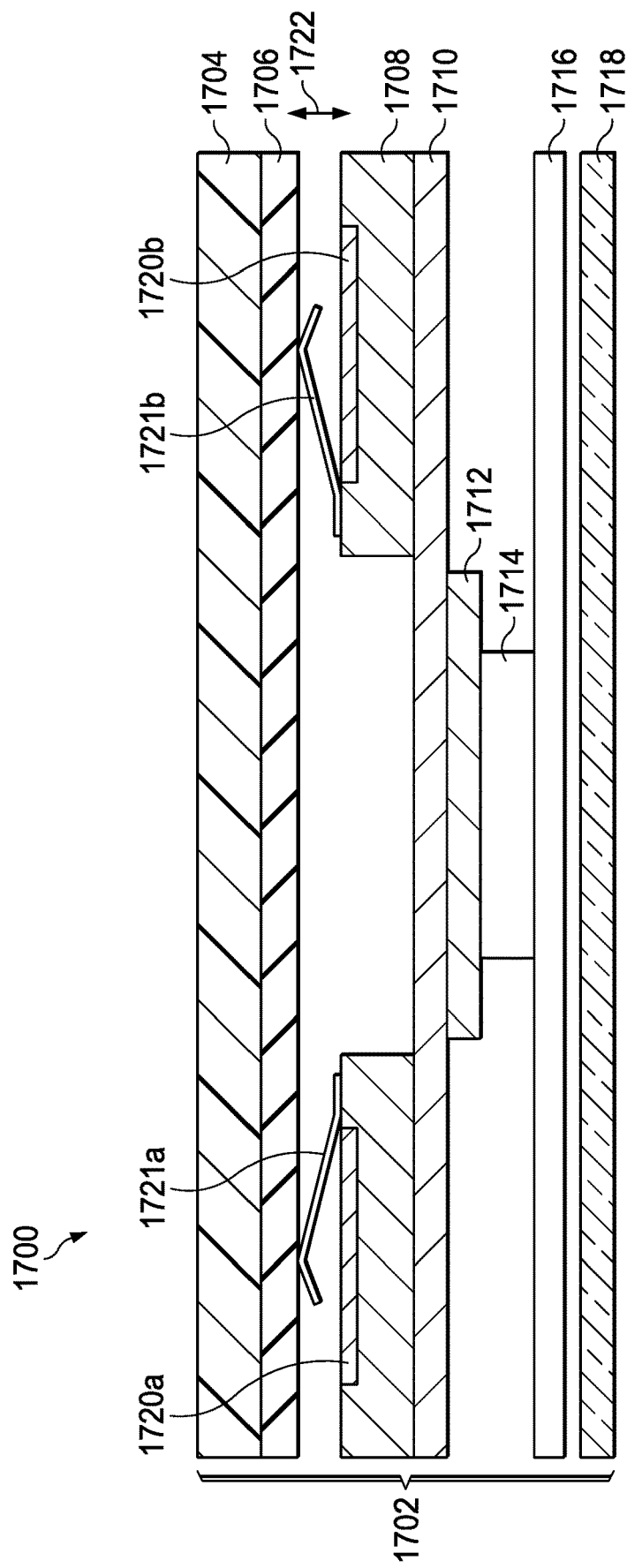
FIGS. 17A and 17B illustrate simplified cross-sections of a movable heat-transfer device installed in a computer, according to some embodiments of the present disclosure.
Figure 17B:
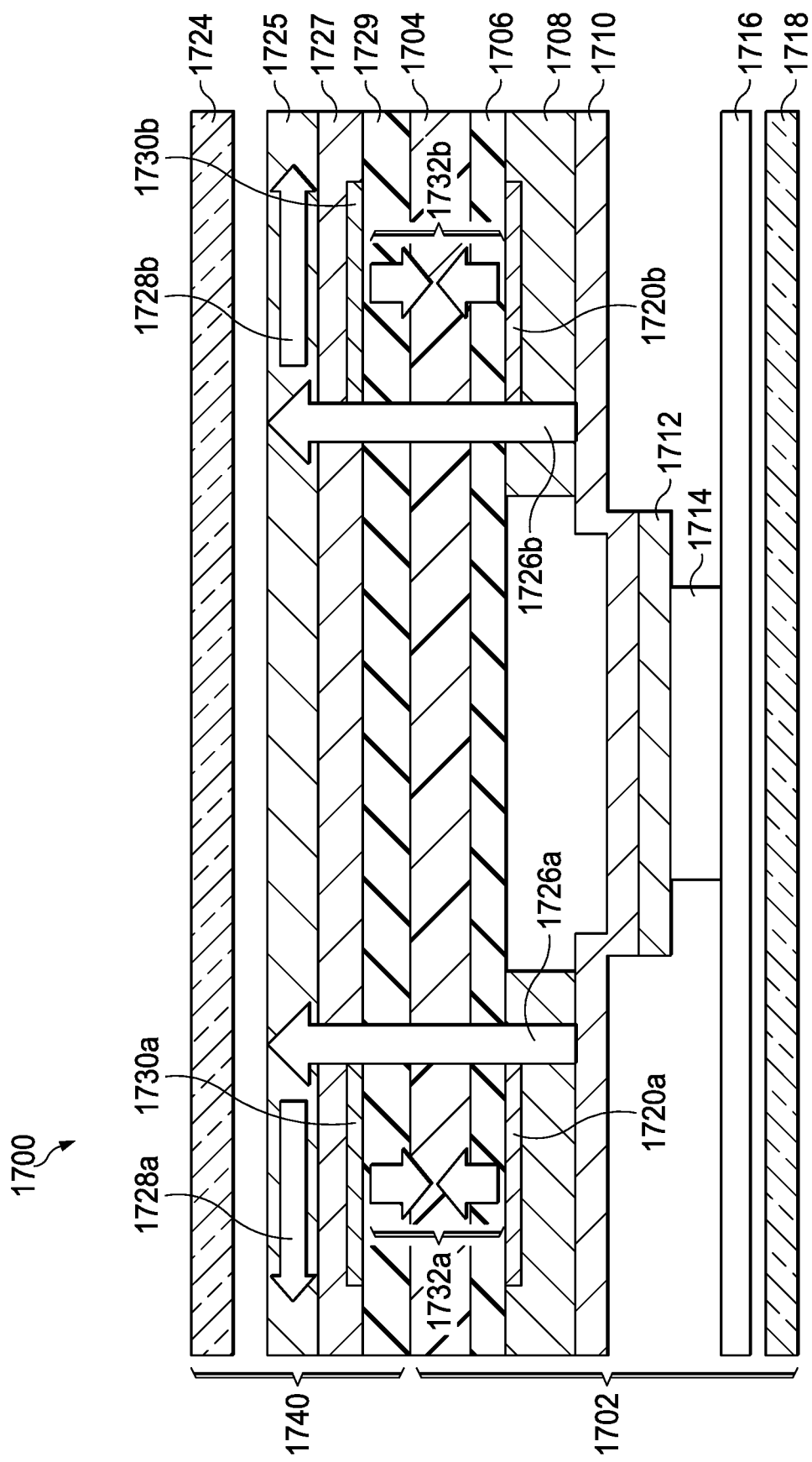

FIGS. 17A and 17B illustrate simplified cross-sections of a computer 1700 including a screen portion 1740 and a keyboard portion 1702. The computer 1700 may be similar to the device 300 of FIG. 3 or any other computer. A movable heat-transfer device is installed in the keyboard portion 1702 of the computer 1700. FIG. 17A illustrates a simplified cross-section of the keyboard portion 1702. FIG. 17B illustrates a simplified cross-section of the keyboard portion 1702 and the screen portion 1740 coupled to one another.

FIG. 17A illustrates a simplified cross-section of the keyboard portion 1702 of the computer 1700. The keyboard portion 1702 includes a keyboard 1718, a circuit board 1716, a processor 1714, a bracket 1712, a rotatable heat-transfer pipe 1710, a heat spreader 1708, magnets 1720a and 1720b, springs 1721a and 1721b, an air gap 1722, a heat-conducting rubber 1706, and a housing 1704. The keyboard 1718 and the processor 1714 are operably coupled to the circuit board 1716. The circuit board 1716 supports the processor 1714. The bracket 1712 attaches the rotatable heat-transfer pipe 1710 to the processor 1714 and enables rotation of the rotatable heat-transfer pipe 1710. The rotatable heat-transfer pipe 1710 is also rotatably coupled to the heat spreader 1708. The magnets 1720a and 1720b and the springs 1721a and 1721b are attached to the heat spreader 1708. The heat-conducting rubber 1706 is attached to an inner surface of the housing 1704 and is thermally conductive. Because the heat-conducting rubber 1706 is thermally conductive, it is able to conduct heat from the heat spreader 1708 to the housing 1704.

Collectively, the bracket 1712, the rotatable heat-transfer pipe 1710, the heat spreader 1708, the magnets 1720a and 1720b, and the springs 1721a and 1721b correspond to a movable heat-transfer device that is operable to transfers heat from the processor 1714 to the housing 1704, e.g., as described with respect to FIGS. 10A, 10B, and 10C. FIG. 17A illustrates the heat-transfer device in a first configuration. In the first configuration, the air gap 1722 separates the heat-conducting rubber 1706 and the heat spreader 1708. Advantageously, a component including magnets corresponding to the magnets 1626a and 1626b may be coupled to the keyboard portion 1702 to reduce the heat associated with (i.e., to cool) the processor 1714 and/or other components within the housing 1704. When such components are attached the computer 1700, the heat-transfer device moves to a second configuration based on attraction between the magnets on the keyboard portion 1702 and magnets in the component. FIG. 17B illustrates some embodiments.

FIG. 17B illustrates the heat-transfer device in the second configuration based on the screen portion 1740 and the keyboard portion 1702 being coupled to one another. The screen portion 1740 includes a screen 1724, a graphite layer 1725, a housing 1727, magnets 1730a and 1730b, and a conductive paint 1729. The magnets 1730a and 1730b are attached to the housing 1727.

The screen portion 1740 and the keyboard portion 1702 are coupled based on attractions 1732a and 1732b between the magnets 1730a and 1720a and the magnets 1730b and 1720b, respectively. In addition, the attractions 1732a and 1732b overcome forces generated by the springs 1721a and 1721b, which compresses the springs 1721a and 1721b, moves the heat spreader 1708 toward the heat-conducting rubber 1706, and closes the air gap 1722. This movement completes paths of thermal conductivity 1726a and 1726b between the heat spreader 1708 and screen portion 1740 via the housing 1704. When attached in this way (e.g., similar to FIG. 3B), the screen portion 1740 helps to cool the processor 1714 based on receiving heat transferred from the processor 1714 via the paths of thermal conductivity 1726a and 1726b. Such heat is then transferred though the graphite layer 1725 as generally indicated by the arrows 1728a and 1728b.

FIG. 18 illustrates a method 1800, according to some embodiments of the present disclosure. The method 1800 may begin at 1802 and advance to 1804, at which a heat-transfer system is coupled to a heat-generating component and a heat spreader. The heat-transfer system may include any one or more of the heat-transfer devices disclosed herein. At 1806, the heat-transfer system is caused to move between a first configuration and a second configuration to selectively close a gap between the heat spreader and a housing. An actuator such as a passive or an active actuator may be activated based on sensors, magnets, springs (e.g., a bent metal plate, a metal coil, or any other spring), wireless communications protocols, combinations thereof, or any other method of initiating such movement. The method 1800 may terminate at 1808. In some embodiments, one or more portions of the method 1800 may repeat, e.g., in a loop.

Although several embodiments have been illustrated and described in detail, numerous other changes, substitutions, variations, alterations, and/or modifications are possible without departing from the spirit and scope of the present disclosure, as defined by the appended claims. The particular embodiments described herein are illustrative only, and may be modified and practiced in different but equivalent manners, as would be apparent to those of ordinary skill in the art having the benefit of the teachings herein. Those of ordinary skill in the art would appreciate that the present disclosure may be readily used as a basis for designing or modifying other embodiments for carrying out the same purposes and/or achieving the same advantages of the embodiments introduced herein. For example, certain embodiments may be implemented using more, less, and/or other components than those described herein. Moreover, in certain embodiments, some components may be implemented separately, consolidated into one or more integrated components, and/or omitted. Similarly, methods associated with certain embodiments may be implemented using more, less, and/or other steps than those described herein, and their steps may be performed in any suitable order.

Numerous other changes, substitutions, variations, alterations, and modifications may be ascertained to one of ordinary skill in the art and it is intended that the present disclosure encompass all such changes, substitutions, variations, alterations, and modifications as falling within the scope of the appended claims.

In order to assist the United States Patent and Trademark Office (USPTO), and any readers of any patent issued on this application, in interpreting the claims appended hereto, it is noted that: (a) Applicant does not intend any of the appended claims to invoke paragraph (f) of 35 U.S.C., section112, as it exists on the date of the filing hereof, unless the words "means for" or "steps for" are explicitly used in the particular claims; and (b) Applicant does not intend, by any statement in the specification, to limit this disclosure in any way that is not otherwise expressly reflected in the appended claims.

The following examples pertain to some embodiments of the present disclosure.

Example 1 is an apparatus comprising: a heat spreader operable to transfer heat to a portion of a housing; and a heat-transfer pipe pivotally coupled to a heat-generating component and the heat spreader, the heat-transfer pipe operable to transfer heat from the heat-generating component to the heat spreader, wherein the heat-transfer pipe and the heat spreader are moveable between a first configuration and a second configuration. In the first configuration, a gap separates the heat spreader and the portion of the housing based on the heat-transfer pipe being at a first orientation. In the second configuration, the heat spreader closes the gap and is thermally coupled to the portion of the housing based on the heat-transfer pipe being at a second orientation.

Example 2 includes the subject matter of Example 1 and may further comprise the heat transfer pipe comprises at least one bend forming continuous, noncollinear portions of the heat-transfer pipe.

Example 3 includes the subject matter of Example 2, wherein the continuous, noncollinear portions of the heat-transfer pipe comprise: at least one shaft portion collinear with a first axis, wherein the at least one shaft portion is coupled to the heat spread; at least one eccentric portion collinear with a second axis, wherein the second axis and the first axis are offset from one another and at least one eccentric portion is coupled to the heat-generating component.

Example 4 includes the subject matter of Example 3, wherein the at least one eccentric portion comprises a plurality of eccentric portions each of which is coupled to a different heat-generating component.

Example 5 includes the subject matter of any one or more of Examples 1-4, wherein the heat-transfer pipe is a first heat-transfer pipe and the heat spreader is a first heat spreader, and further comprising: a second heat-transfer pipe and a second heat spreader, wherein the second heat-transfer pipe is pivotally coupled to the heat-generating component and the second heat spreader.

Example 6 includes the subject matter of any one or more of Examples 1-5, wherein the heat-transfer pipe comprises a fluid configured to transfer heat based on a phase change between a liquid state and a gaseous state.

Example 7 includes the subject matter of any one or more of Examples 1-6 and may further comprise an actuator operable to move the heat-transfer pipe and the heat spreader between the first configuration and the second configuration.

Example 8 includes the subject matter of Example 7, wherein the actuator comprises a passive actuator.

Example 9 includes the subject matter of Example 8, wherein the passive actuator comprises: a spring operable force the heat spreader away from the portion of the housing and create the gap.

Example 10 includes the subject matter of Example 9, wherein the passive actuator comprises: a magnet coupled to the heat spreader, wherein the magnet is operable to attract another magnet and compress the spring.

Example 11 includes the subject matter of Example 7, wherein the actuator comprises an active actuator.

Example 12 includes the subject matter of Example 7 and may further comprise a component configured to couple to the apparatus, wherein the component comprises an activation element configured to activate the actuator based on proximity between the apparatus and the component.

Example 13 includes the subject matter of Example 12, wherein the component comprises one selected from the group consisting of: a cover, a keyboard, a dock, a screen.

Example 14 includes the subject matter of Example 12 and may further comprise a sensor operable to detect whether the component is attached to the housing.

Example 15 includes the subject matter of Example 14, wherein the heat-generating component is operable increasing its clock rate based on the sensor detecting that the component is attached to the housing.

Example 16 includes the subject matter of any one or more of Examples 1-15, wherein the heat comprises heat generated by the heat-generating component.

Example 17 includes the subject matter of any one or more of Examples 1-16, wherein the heat-transfer pipe is rotatable between the first orientation and the second orientation.

Example 18 includes the subject matter of any one or more of Examples 1-17, wherein: in the first configuration, the heat spreader is at a first position; and in the second configuration, the heat spreader is at a second position.

Example 19 includes the subject matter of Example 18 and may further comprise a lateral gap to enable lateral movement of the heat spread as the heat-transfer pipe rotates from the first position to the first position.

Example 20 includes the subject matter of any one or more of Examples 1-19, wherein the gap is configured to break a path of thermal conductivity between the heat spreader and the portion of the housing.

Example 21 includes the subject matter of Example 20, wherein, in the second configuration, the heat spreader connects the path of thermal conductivity between the heat spreader and the portion of the housing.

Example 22 includes the subject matter of any one or more of Examples 1-21, wherein the thermally coupling comprises physical contact between the heat spreader and the housing.

Example 23 includes the subject matter of any one or more of Examples 1-22 and may further comprise a conductive material attached to the housing, wherein the thermally coupling comprises physical contact between the heat spreader and an insulative material attached to the housing.

Example 24 includes the subject matter of any one or more of Examples 1-23 and may further comprise a first bracket pivotally coupling the heat-transfer pipe to the heat-generating component; and a second bracket pivotally coupling the heat-transfer pipe to the heat spreader, wherein each of the first bracket and the second bracket enable rotation by the heat-transfer pipe.

Example 25 includes the subject matter of Example 24 and may further comprise a first fastener coupling the first bracket to the heat-generating component; and a second fastener coupling the second bracket to the heat spreader.

Example 26 includes the subject matter of Example 24 and may further comprise a thermal interface material (TIM) filling a gap between the first bracket and the heat-transfer pipe, wherein the thermal interface material is operable to conduct thermal energy from the first bracket to the heat-transfer pipe and to lubricate contact between the first bracket to the heat-transfer pipe.

Example 27 includes the subject matter of Example 24 and may further comprise a thermal interface material (TIM) filling a gap between the second bracket and the heat-transfer pipe, wherein the thermal interface material is operable to conduct thermal energy from the second bracket to the heat-transfer pipe and to lubricate contact between the second bracket to the heat-transfer pipe.

Example 28 includes the subject matter of any one or more of Examples 1-27, wherein the heat spreader comprises a metallic plate.

Example 29 includes the subject matter of any one or more of Examples 1-28, wherein the heat-transfer pipe comprises a copper alloy.

Example 30 includes the subject matter of any one or more of Examples 1-29, wherein the heat spreader comprises a copper alloy.

Example 31 includes the subject matter of any one or more of Examples 1-30, and may further comprise a circuit board, wherein the heat-generating component is coupled to the circuit board.

Example 32 includes the subject matter of Example 31 and may further comprise a seal coupled to an edge of the heat spreader, wherein the seal forms an inner cavity within the apparatus between the heat spreader and the circuit board.

Example 33 includes the subject matter of Example 31, wherein the seal comprises a conductive material operable to shield electromagnetic interference (EMI) from passing between an inside of the inner cavity and an outside of the inner cavity.

Example 34 includes the subject matter of Example 33, wherein the conductive material comprises one selected from the group consisting of: rubber, silicone, and fluorosilicone.

Example 35 includes the subject matter of any one or more of Examples 1-34, wherein apparatus is a computing device.

Example 36 includes the subject matter of any one or more of Examples 1-35, wherein computing device is selected from the group consisting of a tablet, a mobile phone, and a laptop computer.

Example 37 is a system comprising: a heat spreader operable to transfer heat to a portion of a housing; and a heat-transfer pipe pivotally coupled to a heat-generating component and the heat spreader, the heat-transfer pipe operable to transfer heat from the heat-generating component to the heat spreader, wherein the heat-transfer pipe and the heat spreader are moveable between a first configuration and a second configuration. In the first configuration, a gap separates the heat spreader and the portion of the housing based on the heat-transfer pipe being at a first orientation. In the second configuration, the heat spreader closes the gap and is thermally coupled to the portion of the housing based on the heat-transfer pipe being at a second orientation.

Example 38 includes the subject matter of Example 37 and may further comprise the heat transfer pipe comprises at least one bend forming continuous, noncollinear portions of the heat-transfer pipe.

Example 39 includes the subject matter of Example 38, wherein the continuous, noncollinear portions of the heat-transfer pipe comprise: at least one shaft portion collinear with a first axis, wherein the at least one shaft portion is coupled to the heat spread; at least one eccentric portion collinear with a second axis, wherein the second axis and the first axis are offset from one another and at least one eccentric portion is coupled to the heat-generating component.

Example 40 includes the subject matter of Example 39, wherein the at least one eccentric portion comprises a plurality of eccentric portions each of which is coupled to a different heat-generating component.

Example 41 includes the subject matter of any one or more of Examples 37-40, wherein the heat-transfer pipe is a first heat-transfer pipe and the heat spreader is a first heat spreader, and further comprising: a second heat-transfer pipe and a second heat spreader, wherein the second heat-transfer pipe is pivotally coupled to the heat-generating component and the second heat spreader.

Example 42 includes the subject matter of any one or more of Examples 37-41, wherein the heat-transfer pipe comprises a fluid configured to transfer heat based on a phase change between a liquid state and a gaseous state.

Example 43 includes the subject matter of any one or more of Examples 37-42 and may further comprise an actuator operable to move the heat-transfer pipe and the heat spreader between the first configuration and the second configuration.

Example 44 includes the subject matter of Example 43, wherein the actuator comprises a passive actuator.

Example 45 includes the subject matter of Example 44, wherein the passive actuator comprises: a spring operable force the heat spreader away from the portion of the housing and create the gap.

Example 46 includes the subject matter of Example 45, wherein the passive actuator comprises: a magnet coupled to the heat spreader, wherein the magnet is operable to attract another magnet and compress the spring.

Example 47 includes the subject matter of Example 43, wherein the actuator comprises an active actuator.

Example 48 includes the subject matter of Example 43 and may further comprise a component configured to couple to the housing, wherein the component comprises an activation element configured to activate the actuator based on proximity between the housing and the component.

Example 49 includes the subject matter of Example 48, wherein the component comprises one selected from the group consisting of: a cover, a keyboard, a dock, a screen.

Example 50 includes the subject matter of Example 48 and may further comprise a sensor operable to detect whether the component is attached to the housing.

Example 51 includes the subject matter of Example 50, wherein the heat-generating component is operable increasing its clock rate based on the sensor detecting that the component is attached to the housing.

Example 52 includes the subject matter of any one or more of Examples 37-51, wherein the heat comprises heat generated by the heat-generating component.

Example 53 includes the subject matter of any one or more of Examples 37-52, wherein the heat-transfer pipe is rotatable between the first orientation and the second orientation.

Example 54 includes the subject matter of any one or more of Examples 37-53, wherein: in the first configuration, the heat spreader is at a first position; and in the second configuration, the heat spreader is at a second position.

Example 55 includes the subject matter of Example 54 and may further comprise a lateral gap to enable lateral movement of the heat spread as the heat-transfer pipe rotates from the first position to the first position.

Example 56 includes the subject matter of any one or more of Examples 37-55, wherein the gap is configured to break a path of thermal conductivity between the heat spreader and the portion of the housing.

Example 57 includes the subject matter of Example 56, wherein, in the second configuration, the heat spreader connects the path of thermal conductivity between the heat spreader and the portion of the housing.

Example 58 includes the subject matter of any one or more of Examples 37-57, wherein the thermally coupling comprises physical contact between the heat spreader and the housing.

Example 59 includes the subject matter of any one or more of Examples 37-58 and may further comprise a conductive material attached to the housing, wherein the thermally coupling comprises physical contact between the heat spreader and an insulative material attached to the housing.

Example 60 includes the subject matter of any one or more of Examples 37-59 and may further comprise a first bracket pivotally coupling the heat-transfer pipe to the heat-generating component; and a second bracket pivotally coupling the heat-transfer pipe to the heat spreader, wherein each of the first bracket and the second bracket enable rotation by the heat-transfer pipe.

Example 61 includes the subject matter of Example 60 and may further comprise a first fastener coupling the first bracket to the heat-generating component; and a second fastener coupling the second bracket to the heat spreader.

Example 62 includes the subject matter of Example 60 and may further comprise a thermal interface material (TIM) filling a gap between the first bracket and the heat-transfer pipe, wherein the thermal interface material is operable to conduct thermal energy from the first bracket to the heat-transfer pipe and to lubricate contact between the first bracket to the heat-transfer pipe.

Example 63 includes the subject matter of Example 60 and may further comprise a thermal interface material (TIM) filling a gap between the second bracket and the heat-transfer pipe, wherein the thermal interface material is operable to conduct thermal energy from the second bracket to the heat-transfer pipe and to lubricate contact between the second bracket to the heat-transfer pipe.

Example 64 includes the subject matter of any one or more of Examples 37-63, wherein the heat spreader comprises a metallic plate.

Example 65 includes the subject matter of any one or more of Examples 37-64, wherein the heat-transfer pipe comprises a copper alloy.

Example 66 includes the subject matter of any one or more of Examples 37-65, wherein the heat spreader comprises a copper alloy.

Example 67 includes the subject matter of any one or more of Examples 37-66, and may further comprise a circuit board, wherein the heat-generating component is coupled to the circuit board.

Example 68 includes the subject matter of Example 67 and may further comprise a seal coupled to an edge of the heat spreader, wherein the seal forms an inner cavity within the housing between the heat spreader and the circuit board.

Example 69 includes the subject matter of Example 67, wherein the seal comprises a conductive material operable to shield electromagnetic interference (EMI) from passing between an inside of the inner cavity and an outside of the inner cavity.

Example 70 includes the subject matter of Example 69, wherein the conductive material comprises one selected from the group consisting of: rubber, silicone, and fluorosilicone.

Example 71 includes the subject matter of any one or more of Examples 37-70 and may further comprise a computing device.

Example 72 includes the subject matter of any one or more of Examples 37-71, wherein computing device is selected from the group consisting of a tablet, a mobile phone, and a laptop computer.

Example 73 includes the subject matter of any one or more of Examples 1-72, wherein the heat-generating component comprises at least one selected from the group consisting of: a processor, an integrated circuit, a power source, a power converter, and a sensor.

Example 74 includes the subject matter of any one or more of Examples 1-73, further comprising: a circuit board, wherein the heat-generating component is coupled to the circuit board.

Example 75 includes the subject matter of Example 74, further comprising: a die coupled to the circuit board with solder.

Example 76 includes the subject matter of Example 74 and/or 75, further comprising: a plurality of heat-generating components, wherein each of the plurality of heat-generating components is coupled to the circuit board.

Example 77 is a method comprising: coupling a heat-transfer pipe to a heat-generating component and a heat spreader, wherein the heat-transfer pipe is operable to transfer heat from the heat-generating component to the heat spreader; and moving the heat-transfer pipe and the heat spreader are movable between a first configuration and a second configuration, wherein: in the first configuration, a gap separates the heat spreader and a portion of a housing based on the heat-transfer pipe being at a first orientation, and in the second configuration, the heat spreader closes the gap and is thermally coupled to the portion of the housing based on the heat-transfer pipe being at a second orientation.

Example 78 includes the subject matter of Example 77, wherein the gap breaks a path of thermal conductivity between the heat spreader and the portion of the housing; and in the second configuration, the heat spreader connects the path of thermal conductivity between the heat spreader and the portion of the housing.

Example 79 is a method as disclosed herein.

Example 80 is an apparatus comprising means to perform a method as specified in any of Examples 77-79.

Example 81 is a machine-readable storage including machine-readable instructions, when executed, to implement a method or realize an apparatus as specified in any of Examples 1-36, 77-79.

Example 82 is a machine readable medium including code, when executed, to cause a machine to perform the methods of any one of Examples 77-79.

Example 83 is an apparatus comprising: a processor; and a memory coupled to the processor to store instructions, the instructions, when executed by the processor, to perform the methods of any one of Examples 77-79.

What is claimed is:

1. An apparatus comprising:
   a housing forming a cavity;
   a heat-generating component within the cavity;
   a heat spreader operable to distribute heat over a portion of the housing; and
   a heat-transfer pipe pivotally coupled to the heat-generating component and the heat spreader, the heat-transfer pipe operable to transfer heat from the heat-generating component to the heat spreader, wherein the heat-transfer pipe and the heat spreader are movable between a first configuration and a second configuration, wherein:
      in the first configuration, a gap separates the heat spreader and the portion of the housing based on the heat-transfer pipe being at a first orientation, and
      in the second configuration, the heat spreader closes the gap and is thermally coupled to the portion of the housing based on the heat-transfer pipe being at a second orientation.

2. The apparatus of claim 1, wherein the heat-transfer pipe comprises at least
   one bend forming continuous, noncollinear portions of the heat-transfer pipe.

3. The apparatus of claim 1, wherein the heat-transfer pipe is a first heat-transfer pipe and the heat spreader is a first heat spreader, and further comprising:
   a second heat-transfer pipe and a second heat spreader, wherein the second heat-transfer pipe is pivotally coupled to the heat-generating component and the second heat spreader.

4. The apparatus of claim 1, further comprising:
   an actuator operable to move the heat-transfer pipe and the heat spreader between the first configuration and the second configuration.

5. The apparatus of claim 4, further comprising:
   a component configured to couple to the housing, wherein the component comprises an activation element configured to activate the actuator based on proximity between the housing and the component.

6. The apparatus of claim 5, further comprising:
   a sensor operable to detect whether the component is attached to the housing.

7. The apparatus of claim 6, wherein the heat-generating component is operable increasing its clock rate based on the sensor detecting that the component is attached to the housing.

8. The apparatus of claim 1, wherein the gap is configured to break a path of thermal conductivity between the heat spreader and the portion of the housing.

9. The apparatus of claim 8, wherein, in the second configuration, the heat spreader connects the path of thermal conductivity between the heat spreader and the portion of the housing.

10. A system comprising:
    a housing forming a cavity;
    a heat-generating component within the cavity;
    a heat spreader operable to distribute heat over a portion of the housing; and
    a heat-transfer pipe pivotally coupled to the heat-generating component and the heat spreader, the heat-transfer pipe operable to transfer heat from the heat-generating component to the heat spreader, wherein the heat-transfer pipe and the heat spreader are movable between a first configuration and a second configuration, wherein:

in the first configuration, a gap separates the heat spreader and the portion of the housing based on the heat-transfer pipe being at a first orientation, and in the second configuration, the heat spreader closes the gap and is thermally coupled to the portion of the housing based on the heat-transfer pipe being at a second orientation.

11. The system of claim 10, wherein the heat-transfer pipe comprises at least one bend forming continuous, noncollinear portions of the heat-transfer pipe.

12. The system of claim 10, wherein the heat-transfer pipe is a first heat-transfer pipe and the heat spreader is a first heat spreader, and further comprising:

a second heat-transfer pipe and a second heat spreader, wherein the second heat-transfer pipe is pivotally coupled to the heat-generating component and the second heat spreader.

13. The system of claim 10, further comprising:

an actuator operable to move the heat-transfer pipe and the heat spreader between the first configuration and the second configuration.

14. The system of claim 13, further comprising:

a component configured to couple to the housing, wherein the component comprises an activation element configured to activate the actuator based on proximity between the housing and the component.

15. The system of claim 14, further comprising:

a sensor operable to detect whether the component is attached to the housing.

16. The system of claim 15, wherein the heat-generating component is operable increasing its clock rate based on the sensor detecting that the component is attached to the housing.

17. The system of claim 10, wherein the gap is configured to break a path of thermal conductivity between the heat spreader and the portion of the housing.

18. The system of claim 17, wherein, in the second configuration, the heat spreader connects the path of thermal conductivity between the heat spreader and the portion of the housing.

* * * * *